United States Patent
Richert et al.

(10) Patent No.: US 9,310,676 B2
(45) Date of Patent: Apr. 12, 2016

(54) APPARATUS AND METHOD FOR A SUB MICROSCOPIC AND OPTICALLY VARIABLE IMAGE CARRYING DEVICE

(75) Inventors: Michelle Richert, Illzach (FR); David R. Boswell, Woodley Reading (GB); Mark Robert Dicker, Sandown Isle of Wight (GB); Alexander Stuck, Wettingen (CH)

(73) Assignee: BASF SE, Ludwigshafen (DE)

( * ) Notice: Subject to any disclaimer, the term of this patent is extended or adjusted under 35 U.S.C. 154(b) by 1071 days.

(21) Appl. No.: 13/391,079

(22) PCT Filed: Aug. 9, 2010

(86) PCT No.: PCT/EP2010/061532
§ 371 (c)(1),
(2), (4) Date: Apr. 25, 2012

(87) PCT Pub. No.: WO2011/020727
PCT Pub. Date: Feb. 24, 2011

(65) Prior Publication Data
US 2012/0199994 A1    Aug. 9, 2012

(30) Foreign Application Priority Data

Aug. 21, 2009    (EP) .................................... 09168389

(51) Int. Cl.
*B29C 35/08* (2006.01)
*G03F 7/00* (2006.01)
*B29C 39/14* (2006.01)
(Continued)

(52) U.S. Cl.
CPC ............ *G03F 7/0002* (2013.01); *B29C 39/148* (2013.01); *B29C 59/026* (2013.01); *B29C 59/046* (2013.01); *B82Y 10/00* (2013.01); *B82Y 40/00* (2013.01); *B29C 35/0888* (2013.01);
(Continued)

(58) Field of Classification Search
USPC .......................................... 264/1.35, 494, 485
See application file for complete search history.

(56) References Cited

U.S. PATENT DOCUMENTS

| 3,018,262 A | 1/1962 | Schroeder |
| 3,117,099 A | 1/1964 | Proops et al. |

(Continued)

FOREIGN PATENT DOCUMENTS

| EP | 0 119 425 | 9/1984 |
| EP | 0 161 697 | 11/1985 |

(Continued)

OTHER PUBLICATIONS

U.S. Appl. No. 13/823,348, filed May 1, 2013, Bolle, et al.
(Continued)

*Primary Examiner* — Christina Johnson
*Assistant Examiner* — Xue Liu
(74) *Attorney, Agent, or Firm* — Oblon, McClelland, Maier & Neustadt, L.L.P.

(57) ABSTRACT

The present invention relates generally to an apparatus for embossing a flexible substrate. More specifically, the present invention relates to an apparatus for embossing a curable composition coated flexible substrate with an optically variable image transferred from an embossing foil, especially belt, or sheet of an optically transparent fluoropolymer. The optically variable image is irradiated through the embossing belt, or sheet with ultraviolet light contemporaneously with the embossing so that the transferred imprint pattern cures, hardens, and retains its shape.

9 Claims, 7 Drawing Sheets

(51) Int. Cl.
  *B29C 59/02* (2006.01)
  *B29C 59/04* (2006.01)
  *B82Y 10/00* (2011.01)
  *B82Y 40/00* (2011.01)

(52) U.S. Cl.
  CPC . *B29C2035/0827* (2013.01); *B29C 2035/0877* (2013.01); *B29C 2059/023* (2013.01)

(56) References Cited

U.S. PATENT DOCUMENTS

| | | |
|---|---|---|
| 4,299,938 A | 11/1981 | Green et al. |
| 4,339,567 A | 7/1982 | Green et al. |
| 4,444,974 A | 4/1984 | Takase et al. |
| 4,758,296 A | 7/1988 | McGrew |
| 4,772,672 A | 9/1988 | Isozaki et al. |
| 6,048,953 A | 4/2000 | Kawashima et al. |
| 7,070,406 B2 | 7/2006 | Jeans |
| 2003/0071016 A1 | 4/2003 | Shih et al. |
| 2003/0227099 A1 | 12/2003 | Makansi |
| 2004/0219246 A1 | 11/2004 | Jeans |
| 2006/0188598 A1 | 8/2006 | Jeans |
| 2007/0204953 A1 | 9/2007 | Lin |
| 2009/0046362 A1 | 2/2009 | Guo et al. |
| 2010/0090455 A1 | 4/2010 | Boswell et al. |
| 2011/0008399 A1 | 1/2011 | Bugnon et al. |
| 2011/0033664 A1 | 2/2011 | Dicker et al. |
| 2012/0029121 A1 | 2/2012 | Ormerod et al. |

FOREIGN PATENT DOCUMENTS

| | | |
|---|---|---|
| EP | 0 339 841 | 11/1989 |
| EP | 0 438 123 | 7/1991 |
| EP | 0 624 826 | 11/1994 |
| EP | 0 898 202 | 2/1999 |
| EP | 1 092 757 | 4/2001 |
| EP | 1 473 594 | 11/2004 |
| GB | 2 180 358 | 3/1987 |
| JP | 2 289611 | 11/1990 |
| JP | 10 171119 | 6/1998 |
| JP | 10 301276 | 11/1998 |
| JP | 2007-320072 A | 12/2007 |
| WO | 90 01512 | 2/1990 |
| WO | 98 47046 | 10/1998 |
| WO | 99 47617 | 9/1999 |
| WO | 2004 074242 | 9/2004 |
| WO | 2005 049745 | 6/2005 |
| WO | 2005 051675 | 6/2005 |
| WO | 2006 008251 | 1/2006 |
| WO | 2008 009575 | 1/2008 |
| WO | 2008 055807 | 5/2008 |
| WO | 2008 061930 | 5/2008 |
| WO | 2008 124180 | 10/2008 |
| WO | 2009 062867 | 5/2009 |
| WO | 2010 069823 | 6/2010 |

OTHER PUBLICATIONS

U.S. Appl. No. 13/511,582, filed Jun. 27, 2012, Grigorenko, et al.
International Search Report Issued Sep. 23, 2010 in PCT/EP10/61532 Filed Aug. 9, 2010.

Holographic Decalomanie

APPARATUS AND METHOD FOR A SUB MICROSCOPIC AND OPTICALLY VARIABLE IMAGE CARRYING DEVICE

The present invention relates generally to an apparatus for embossing a flexible substrate. More specifically, the present invention relates to an apparatus for embossing a curable composition coated flexible substrate with an optically variable image transferred from an embossing foil, especially belt, or sheet of an optically transparent fluoropolymer. The optically variable image is irradiated through the embossing belt, or sheet with ultraviolet light contemporaneously with the embossing so that the transferred imprint pattern cures, hardens, and retains its shape.

S. Ahn et al., Adv. Mater. 2008, 20, 2044-2049 (WO2008124180) discloses a Roll-to-Roll Imprint process: A flexible ETFE mold was wrapped on a stainless steel imprint roller (diameter: 60 mm, width: 10 mm) using double-sided adhesion tape. A 1 mm thick rubber cushion layer was placed between the roller and the ETFE mold to ensure adequate conformal contact. Liquid resist material was continuously coated on the flexible PET substrate in the coating module. The amount of resist material was adjusted by the doctor blade fixed in the two-DOF (linear, tilting) stage. The PDMS resist precursor was cured by convention heating (hot-air gun, Steinel) and epoxysilicone resist by UV exposure (7.2 $Wcm^{-2}$, EXFO Inc.). Al film of various thicknesses (50 nm, 70 nm, 100 nm) was thermally deposited on the grating structures in a separate evaporator.

Current roll-to-roll soft lithography processes for embossing a photopolymer coated web include a process and apparatus used by Epigem Ltd., wherein a web material that is transparent to ultraviolet light is coated with a layer of photopolymer resist and the coated side of the web is brought into contact with an embossing shim that carries an imprint pattern. When the web separates from the embossing shim, the imprint pattern is embossed in (i.e. is replicated in) the layer of photopolymer resist. An ultraviolet light source irradiates the layer of photopolymer resist through the web and cures the embossed pattern so that the pattern hardens and retains its embossed shape. Because the web is transparent to the ultraviolet light, placement of the ultraviolet light source is not problematic and the embossing shim can be opaque to ultraviolet light and the irradiation can occur from the web side.

One disadvantage of the above apparatus is that if the web material and the embossing shim are opaque to ultraviolet light, then the irradiation will not be effective from the web side or the embossing shim side. Accordingly, if a roll-to-roll process requires the web material to be opaque to ultraviolet light, then the embossing shim must be optically transparent to the ultraviolet light so that the irradiation of the embossed pattern in the layer of photopolymer resist can occur from the embossing shim side.

U.S. Pat. No. 4,758,296 describes a method of manufacturing surface relief holograms wherein an original surface relief hologram in the form of an endless loop or a drum is continuously coated with a radiation-curable resin. After curing, the resin bears a replica of the original hologram and it is continuously drawn off from the original as a sheet or film. The replica film becomes a hot-stamping foil when formed in contact with a carrier film, metallized, and coated with a hot-stamping adhesive.

US2003227099 relates to an improved process for creating a rainbow and/or hologram image on a thermoplastic fibrous sheet or polymeric film by embossing a diffraction grating and/or hologram groove pattern from an embossing shim onto the sheet or film. An embossing shim of flexible polymeric film is employed rather than a hard metal shim, as had been used heretofore. The embossing shim is a polymeric film, preferably of polyester.

US2004219246 (U.S. Pat. No. 7,070,406) relates to an apparatus for embossing a photopolymer coated flexible substrate with an imprint pattern transferred from an imprint stamp carried by an optically transparent compliant media (embossing belt). The imprint stamp is irradiated through the compliant media with ultraviolet light contemporaneously with the embossing so that the transferred imprint pattern cures, hardens, and retains its shape. The embossing belt comprises an optically transparent belt material and an optically transparent complaint media connected with the belt material, the compliant media including an optically transparent imprint stamp having an imprint pattern therein.

US2007204953 describes a method for forming structured film comprising the steps of: A) coating a curable adhesive resin on a substrate layer to form a curable adhesive resin layer on said substrate layer; said curable adhesive resin selected from the group consisting of a photocuring adhesive resin and a heat-curing adhesive resin; B) molding or forming or imprinting a structured pattern on said adhesive resin layer by a tape die having said structured pattern preformed on said tape die; and C) curing said curable adhesive resin layer on said substrate layer to obtain a layered film having said structured pattern cured and stably formed on said adhesive resin layer and having said adhesive resin layer firmly bonded with said substrate layer.

The tape die is made of tape or belt having high mechanical strength, durable for fatigue failure, either of metallic or non-metallic materials. The structured pattern stably formed on the tape die is made of anti-sticking materials for preventing from adhesion by the adhesive resin, being durable for scratching, and firmly bonded to the tape die.

WO2005051675 is directed to a method for forming a holographic diffraction grating on a substrate comprising the steps of: a) applying a curable compound to at least a portion of the substrate; b) contacting at least a portion of the curable compound with diffraction grating forming means; c) curing the curable compound and d) depositing a metallic ink on at least a portion of the cured compound.

WO2008061930 is directed to a method for forming an optically variable image on a substrate comprising the steps of:
A) applying a curable compound, or composition to at least a portion of the substrate;
B) contacting at least a portion of the curable compound with optically variable image forming means;
C) curing the curable compound and D) optionally depositing a metallic ink on at least a portion of the cured compound, wherein the optically variable image forming means comprise a) a transparent carrier, b) a transparent material which carries an optically variable image to be applied, and c) means to dry or cure a varnish. The transparent carrier can be a cylinder, a belt or a plate. The optically variable image forming means comprise preferably a) a transparent cylinder of quartz, b) a transparent plastic material carrying the optically variable image to be applied, which is mounted on the surface of the quartz cylinder, and (c) means to dry or cure the varnish arranged within the transparent cylinder.

WO2009062867 is directed to a method for producing a duplicated shim comprising the following steps: (a) coating at least part of a (filmic) substrate with the UV-curable composition (ultra violet curable lacquer) according to any of claims 1 to 4 on its upper surface, especially printing a filmic substrate with the UV-curable composition on its upper surface, (b) casting (transferring) an optically variable image into at least part of the surface of the UV-curable composition with an original shim having the optically variable image thereon,
(c) imparting the optically variable image into the UV-curable composition and instantly curing; for example via a UV lamp, or electron beam radiation to produce the duplicated shim;
(d) separating the duplicated shim from the original shim, whereby in case the substrate is a cylinder the duplicated shim is obtained; and in case the substrate is a sheet of a (plastic) material the sheet of a (plastic) material is processed to the duplicated shim.

The processing to the duplicated shim involves mounting the sheet of a (plastic) material to a cylinder, or forming a belt system comprising a quartz tube having an UV lamp mounted inside, a chilled drive roller and a belt of the sheet of the (plastic) material. The duplicated shim can be used in the process of WO2005051675.

It is an object of the present invention to provide a method for forming a transfer medium to transfer sub microscopic and optically variable images in the form of a foil, especially a belt, or flat sheet.

The present invention provides new and unique articles of manufacture and method for forming a transfer shim in a transparent form constructed in an optically transparent fluoropolymer holding optically variable (sub microscopic) images. In addition, the present invention relates to an apparatus and method for forming a transparent optically variable device transfer system constructed by means of recombining images or devices such as a hologram, kinegram, electron beam, dot matrix, direct write, zero gratings, mechanical or other straight line gratings, lenticular and lens structures into the surface of optically transparent fluoropolymer. More particularly, the present invention concerns the construction of a transfer medium in the form of a belt, or sheet to facilitate the transfer of the recombined images held within the surface of the optically transparent fluoropolymer into an ultra violet curable composition which is cured by means of ultra violet light and optionally subsequently over printed with a specially formulated vacuum metallised ink system, in-line on-press.

Accordingly, the present invention provides a transfer apparatus, comprising:
a flexible substrate;
a coating unit for depositing a curable composition on the substrate;
an embossing foil, or sheet of an optically transparent fluoropolymer, such as polytetrafluoroethylene, carrying the optically variable image to be applied;
an ultraviolet light source for irradiating the replicate pattern with an ultraviolet light through the embossed belt material, the irradiating occurring contemporaneously with the embossing of the optically variable image.

In the sense of the present invention "embossing" shall mean the transfer of the optically variable device (OVD), such as diffractive structures including holograms, from the surface of the transparent foil or sheet (shim) of the optically transparent fluoropolymer to the surface of the substrate without the use of heat or excessive pressure into the (UV) curable composition (varnish). (OVDs).

The foil can be arranged on a carrier, such as, for example, a cylinder, or a plastic film. In this case the shim is a cylinder comprising the optically transparent fluoropolymer carrying the optically variable image; or the shim is a cylinder comprising the optically transparent fluoropolymer carrying the optically variable image; or the duplicated shim is a belt system of a (plastic) material comprising the optically transparent fluoropolymer carrying the optically variable image.

The optically transparent fluoropolymer foil, or sheet can be connected with an optically transparent material to form an embossing belt, or can be connected with an optically transparent cylinder to form an embossing drum.

In an embodiment of the present invention, the embossing apparatus includes a flexible substrate, a coating unit for depositing a curable composition and an embossing drum that includes an optically transparent cylinder including the optically transparent fluoropolymer material carrying the optically variable image (OVI) to be applied. The OVI is embossed in the curable material to form a replicate pattern in the photopolymer material.

Most preferred the foil is a belt of the optically transparent fluoropolymer carrying the optically variable image, which doesn't comprise a carrier, i.e. is carrier-free.

The fluoropolymer shim is quicker and less costly to produce than metal shims made using conventional processes.

In a preferred embodiment the present invention is directed to a transfer apparatus, comprising:
a flexible substrate;
a coating unit for depositing a curable composition on the substrate;
an embossing unit comprising an embossing belt, or sheet of an optically transparent fluoropolymer, such as polytetrafluoroethylene, carrying the optically variable image to be applied;
a plurality of transport rollers connected with the belt material and operative to support the embossing belt;
an ultraviolet light source for irradiating the replicate pattern with an ultraviolet light through the embossed belt material, the irradiating occurring contemporaneously with the embossing of the optically variable image.

In said embodiment an embossing belt is more preferred than an embossing sheet.

The present invention is now illustrated in more detail on basis of an embossing belt, but is not limited thereto.

One advantage of the apparatus of the present invention is that the irradiation occurs through the optically transparent fluoropolymer belt so that the flexible substrate can be opaque to ultraviolet light. Another advantage of the present invention is that the ultraviolet light source can be placed inside the optically transparent fluoropolymer belt.

In one embodiment of the present invention, the embossing apparatus includes a flexible substrate, a coating unit for depositing a curable composition on the flexible substrate, and an embossing unit comprising an embossing belt including an optically transparent fluoropolymer material carrying the optically variable image (OVI) to be applied. The OVI will be embossed in the curable composition to form a replicate pattern in the curable material. A plurality of transport rollers are connected with the belt material and are operative to support the embossing belt. Tension roller(s) and nip roller(s), or chilled roller(s) are connected with the belt material and are operative to support the embossing belt.

Preferably, the embossing unit comprises at least one chilled roller.

In a preferred embodiment of the present invention chilled roller(s) and tension roller(s) are connected with the belt material and are operative to support the embossing belt. The chilled rollers provide sufficient cooling. The tension rollers generate a pressure so that a tension is imparted in the embossing belt. Reference is made to FIG. 5.

The shim belt 200 is continuously running around chilled roller(s) 202 and tension roller 205. A web of a substrate, especially paper, aluminium, or another opaque substrate 201 printed with an ultra violet curable lacquer 207 on its surface passes between nip roller 206 and chilled roller 202, where the OVI is imparted into the lacquer and instantly cured via an UV lamp 204 disposed on the rear side (side, which is not in contact with the UV curable lacquer) of the shim belt 200.

In said embodiment the embossing unit comprises
a shim belt 200, which is continuously running around chilled roller(s) 202 and tension roller 205,
a nip roller 206 arranged next to the chilled roller 202, where the coated side of the substrate 201 is brought into contact with the shim belt 200 and the OVI is replicated in the curable material,
an UV lamp 204 disposed on the rear side of the shim belt 200 for instantly curing ultra violet curable lacquer 207.

In another preferred embodiment of the present invention nip roller(s) and tension roller(s) are connected with the belt material and are operative to support the embossing belt. A chilled roller is arranged next to the nip roller(s). Reference is made to FIG. 6.

The shim belt 200 is continuously running around nip roller(s) 206 and tension roller(s) 205. A web of a substrate, especially paper, aluminium, or another opaque substrate 201 printed with an ultra violet curable lacquer 207 on its surface passes between nip roller 206 and chilled roller 202, where the OVI is imparted into the lacquer and instantly cured via an UV lamp 204 disposed on the rear side of the shim belt 200.

In said embodiment the embossing unit comprises
a shim belt 200, which is continuously running around nip roller(s) 206 and tension roller(s) 205,
a chilled roller 202 arranged next to the nip roller 206, where the coated side of the substrate 201 is brought into contact with the shim belt 200 and the OVI is replicated in the curable material,
an UV lamp 204 disposed on the rear side of the shim belt 200 for instantly curing ultra violet curable lacquer 207.

A drive unit imparts a drive motion to the embossing belt and the flexible substrate so that the coated side of the flexible substrate is brought into contact with the embossing belt and the OVI is replicated in the curable material. A backing drum is wrapped by a portion of the opposite side of the flexible substrate and by a portion of embossing belt so that a tension is imparted in the embossing belt and that tension generates a pressure between the flexible substrate and the embossing belt.

The substrate may comprise any sheet material. The substrate may be opaque, substantially transparent or translucent, wherein the method of the present invention is especially suited for substrates, which are for opaque to UV light (non-transparent). The substrate may comprise paper, leather, fabric such as silk, cotton, tyvac, filmic material or metal, such as aluminium. The substrate may be in the form of one or more sheets or a web. The substrate may be mould made, woven, non-woven, cast, calendared, blown, extruded and/or biaxially extruded.

The substrate may comprise paper, fabric, man made fibres and polymeric compounds. The substrate may comprise any one or more selected from the group comprising paper, papers made from wood pulp or cotton or synthetic wood free fibres and board. The paper/board may be coated, calendared or machine glazed; coated, uncoated, mould made with cotton or denim content, Tyvac, linen, cotton, silk, leather, polythyleneterephthalate, polypropylene propafilm, polyvinylchloride, rigid PVC, cellulose, tri-acetate, acetate polystyrene, polyethylene, nylon, acrylic and polytherimide board. The polythyleneterephthalate substrate may be Melienex type film orientated polypropylene (obtainable from DuPont Films Williamington Del. product ID Melinex HS-2).

The substrate may comprise papers and board made from wood pulp or cotton or synthetic wood free fibres. The paper/board may be coated, calendared or machine glazed.

The coating unit comprises preferably a coater selected from the group consisting of a gravure coater, a flexo coater, a micro gravure coater, and a slot die coater.

A large number of the most varied kinds of light source may be used. Both point sources and planiform radiators (lamp arrays) are suitable. Examples are carbon arc lamps, xenon arc lamps, medium-pressure, super-high-pressure, high-pressure and low-pressure mercury radiators doped, where appropriate, with metal halides (metal halide lamps), microwave-excited metal vapour lamps, excimer lamps, superactinic fluorescent tubes, fluorescent lamps, argon incandescent lamps, flash lamps, photographic floodlight lamps, lightemitting diodes (LED), electron beams and X-rays. Advantageously the dose of radiation used in process step c) is e.g. from 1 to 1000 mJ/cm$^2$. When the lamp is a medium pressure mercury lamp, it may have a power in the range of 40-450 Watts. Preferably, the U.V. lamp is disposed on (plate) or in (cylinder) the means for forming an optically variable image.

The U.V. light source may comprise a lamp. The lamp may have a power in the range of 200-450 Watts. Preferably, the U.V. lamp is disposed on (plate) or in (cylinder) the means for forming an optically variable image.

In a preferred embodiment the ultraviolet light source further includes a reflector for focusing the ultraviolet light at a point where the optically variable image to be applied is urged into contact with the coated side so that the curable composition is not cured before the optically variable image is embossed into the curable composition.

The transfer foil, especially belt, or sheet, very especially belt of an optically transparent fluoropolymer carrying the optically variable image to be applied is new and forms a further object of the present invention.

In addition, the present invention is directed to optically variable image forming means, comprising the embossing foil, especially belt, or sheet, very especially belt of optically transparent fluoropolymer carrying the optically variable image to be applied.

The fluoropolymer is essentially a non-stick coating with a very low surface tension.

The fluoropolymer is resistant to temperature extremes (from −200° C. to +150° C.—short time up to 230° C.), has a high heat absorption ability and an adequate embossability.

The fluoropolymer has a high degree of transparency as well as a high mechanical rigidity, i.e. a high abrasion resistance.

The optically transparent fluoropolymer is preferably a material selected from the group consisting of a perfluoroethylene propylene copolymer, polytetrafluoroethylene, a copolymer from tetrafluoroethylene (TFE) and perfluorinated co-components, a copolymer of ethylene and tetrafluorethylene (ETFE), polyvinylidenfluoride (PVDF)-copolymer and PVDF-homopolymer, copolymer from tetrafluoroethylene and hexafluorpropylene (HFP), and a terpolmer made from TFE, HFP und vinylidenfluoride (VDF) units.

The transparent fluoropolymer contains preferably no additives, such as lightstabilizers, optical brighteners, etc., and posses excellent UV stability and heat stability. The preferred range of thickness of the transparent fluoropolymer belt is 25 to 1000 microns with a preferred range of between 80 to 300 microns.

The transparent fluoropolymer is for example available from Nowofol under the tradename NOWOFOL ET (film out of ethylene and tetrafluoroethylene (ETFE)), NOWOFOL PVDF (non oriented or monoaxially oriented film out of polyvinylidenfluoride (PVDF) copolymer and PVDF homopolymer), NOWOFOL THV (film out of a terpolmer made from TFE, hexafluorpropylene (HFP) und VDF units), NOWOFOL PFA (film out of a copolymer from tetrafluorethylene and perfluorinated co-components), NOWOFOL FEP (film out of a copolymer from tetrafluorethylene and hexafluorpropylene).

The at present most preferred materials are copolymers of ethylene and tetrafluorethylene (ETFE). The copolymers have a thickness of 10 to 250 μm, preferably 80 to 220 μm, most preferred about 200 μm. Such copolymers are, for example, available under the tradename NOWOFOL ET (Nowofol), or Teflon® FEP 160 (a perfluoroethylene propylene copolymer available from DuPont Fluoropolymers). Said materials are characterized by a high tensile strength at break, resistance to tear and penetration, excellent resistance against UV and weathering, high degree of transparency, self-cleaning, optimal resistance to chemicals, resistant to temperature extremes (from −200° C. to +150° C.—short time up to 230° C.), flame retardant, and outstanding separating quality. The at present most preferred fluoropolymer is NOWOFOL ET 6235. Alternatively, Teflon FEP 160 (DuPont Fluoropolymers; a FEP (Perfluoroethylene Propylene Copolymer) plastic material) can be used.

In a further embodiment the present invention is directed to a method for forming an optically variable image (an optically variable device) on a substrate comprising the steps of;
A) applying a curable composition (varnish) to at least a portion of the substrate;
B) contacting at least a portion of the curable composition with optically variable image forming means;
C) curing the composition;
D) optionally depositing a layer of a transparent high reflective index material and/or a metallic layer on at least a portion of the cured composition, wherein the optically variable image forming means, comprise an optically transparent embossing foil, especially belt, or sheet of an optically transparent fluoropolymer carrying the optically variable image to be applied and means to dry or cure the curable compound.

Preferably, the optically variable image forming means comprise an optically transparent embossing belt, or sheet of an optically transparent fluoropolymer carrying the optically variable image to be applied and means to dry or cure the curable compound. In case of the embossing belt the means to dry or cure the curable compound are preferably arranged within the transparent belt. In said embodiment an embossing belt is more preferred than an embossing sheet.

Advantageously, the present invention provides a method of manufacture to transfer and optionally metallise a (sub-microscopic) optically variable image, such as a holographic or other diffraction grating directly onto the surface of a substrate and to do so with high productivity and low cost.

If the method is used for forming a security product, it may comprise the steps of:
A) providing a sheet of base material, said sheet having an upper and lower surface and being a component of the security product;
B) forming an optically variable image on at least a portion of the upper surface of the base material; and
C) depositing an ink of a transparent high reflective index material and/or a metallic ink on at least a portion of the optically variable image.

In accordance with a further aspect of the present invention, there is provided an in-line method of printing on a substrate using a conventional printing press apparatus together with means for forming an optically variable image, comprising the steps of:
A) forming an optically variable image on a discrete portion of the substrate; and
B) depositing an ink of a transparent high reflective index material and/or a metallic ink on at least a portion of the optically variable image.

Furthermore, it would be advantageous to form the optically variable image in register directly on the substrate to which the (sub-microscopic) image is to be applied.

In a preferred embodiment of the present invention a coloured, or metallic ink is deposited on a substrate, on which the optically variable image is formed; before forming the optically variable image on at least a portion of the coloured, or metallic ink.

The substrate is preferably a non-transparent (opaque) sheet material, such as, for example, paper.

The curable composition is preferably deposited by means of gravure or flexographic printing.

The curable composition is preferably curable by means of an ultraviolet (U.V.) light or an electron beam. The curable composition can be coloured.

Diffraction requires that the medium the grating is made of and the media bordering the grating have a difference in optical index. The larger this difference is, the brighter the diffraction will appear. To create highest diffraction, full reflective materials such as metals like aluminum, copper or gold, are thin film coated onto the surface of the grating. Alternately, the grating is coated with a thin film of transparent material having a high refractive index (HRI).

The metallic layer, or the layer of the transparent high reflective index material can be deposited by physical vapour deposition, but are preferably formed by depositing a metallic ink, or an ink of a transparent high reflective index material on the cured composition.

The metallic ink comprise preferably any one or more selected from the group comprising aluminium, stainless steel, nichrome, gold, silver, platinum and copper.

Paper, aluminium, or another opaque substrate is printed with an ultra violet curable composition on its lower surface. An optically variable image (OVI) is cast into the surface of the composition with the fluoropolymer shim having the OVI thereon. The OVI is imparted into the composition and instantly cured via an UV lamp disposed through the fluoropolymer shim at normal processing speeds through. The OVI is a facsimile of the image on the fluoropolymer shim. Metallic ink is printed over the OVI and causes the optically variable device or other lens or engraved structure to become light reflective. Further colours can be subsequently conventionally printed in-line at normal printing process speeds.

In an alternative embodiment paper, aluminium, or another opaque substrate is printed conventionally with a number of coloured inks. Using, for example, a Cerutti R950 printer (available from Cerrutti UK Long Hanborough Oxon.). The substrate is then printed with an ultra violet curable composition on the surface of a paper, aluminium, or another opaque substrate. An OVI is cast into the surface of the composition with a fluoropolymer shim having the OVI thereon, the OVI is imparted into the composition and instantly cured via a UV lamp at normal processing speeds, becoming a facsimile of the image disposed on the fluoropolymer shim. A metallic ink is printed over the OVI and causes the optically variable device (OVD) to become light reflective.

In an alternative embodiment, an UV primer, which is applied to the substrate and when exposed to the UV light source is pre-cured. The pre-curing is not complete but stable enough to have received the diffraction pattern or array of sub-microscopic images. The pre-cured coating is then exposed to an additional UV light source and totally cured. In said embodiment alternatively to the UV primers of the free radical type system cationic systems can be used.

In addition to excellent adhesion to metals and polyolefins and other plastics, cationic epoxy based chemistry may offer other benefits, such as, for example, low shrinkage on curing, good flexibility, low odour in the formulation and cured film. Low toxicity and skin irritation, no oxygen inhibition, improved gas barrier properties, good electrical properties, high chemical and solvent resistance and lower viscosity of the resins could aid printability.

In an alternative embodiment, the paper, aluminium, and all manner of other opaque substrate is replaced with a filmic substrate. Such material is substantially transparent and therefore the image is visible from both sides of the surface.

A filmic substrate is printed conventionally with a number of coloured inks, using, for example, a Cerutti R950 printer (available from Cerrutti UK Long Hanborough Oxon.). The substrate is then printed with an ultra violet curable lacquer. An OVI is cast into the surface of the curable composition with a transparent fluoropolymer shim having the OVI thereon, the holographic image is imparted into the lacquer and instantly cured via a UV lamp, becoming a facsimile of the OVI disposed on the shim. A metallic ink is printed over the OVI and causes the OVI to become light reflective, the OVI is visible on the first surface of a paper or other non-filmic substrate and both sides of the filmic substrate.

In another embodiment, the UV curable composition is replaced with an electronic beam curable composition and the UV lamp replaced with an electron beam emitting device.

A conventional printing press rotogravure, UV flexographic or similar can have an extra station added, this being an embossing station. Using any pre-coated/lacquered embossable film, the substrate is first embossed (first station), then printed using a specifically formulated metallic ink to produce the metallised effect. Conventional printing can also be carried out on the same press. As the metallic ink is formulated like a normal ink, conventional printing methods can be utilised. The printing of the metallic ink can be anywhere in the line; it does not have to come directly after embossing. If an encoder for example an indexing machine which marks the sheet or web so that the mark can be recognised by the print operator is placed in the embossing area and the embossing head has specified areas of imagery, then register to print can be achieved. Printing of the metallic ink can be solid, semi translucent etc, with the resulting effect being that in one pass of the printing press metallising, semi-metallising, de-metallising and normal printing of colours in or not in register can be achieved. The specifically formulated metallic ink can be printed on either side of the film, however generally this will be carried out on the embossed side, to encapsulate the holographic embossed image/pattern so that it remains intact, should it come into contact with any filling agents such as liquids, grease, solvents, lacquers, inks or any other surface contaminants or foreign bodies of any kind.

Alternately, the OVD is coated with a thin film of transparent material having a high refractive index (HRI). Examples are transparent polymers having greater refractive index than the hologram forming layer (n=ca. 1.50), such as, for example, PEI (polyetherimide; n=1.65-1.77) PEEK (polyetheretherketone; n=1.66-1.67), and polysulfones (n=1.63-1.65). In addition, extrinsic high refractive index polymers result of the incorporation of high refractive index materials, especially nanoparticles into conventional polymers or intrinsic high refractive index polymers.

The transparent high reflective index material is preferably selected from nanoparticles of polymethylmethacrylat (PMMA), ZnS, ZnO, Si, $Sb_2S_3$, $Fe_2O_3$, PbO, PbS, ZnSe, CdS, $TiO_2$, $PbCl_2$, $CeO_2$, $Ta_2O_5$, ZnO, CdO, and $Nd_2O_3$, wherein nanoparticles of PMMA, nanoparticles of $TiO_2$ and platelets of ZnS are preferred. Substrates coated with a transparent HRI coating are often used for security applications such as identification or access cards, where it is desired that information positioned behind the hologram remains visible to the unaided eye.

The OVD of the present invention may either comprise a metallic layer, or layer of the transparent high reflective index material on the cured embossed varnish or a layer of the transparent high reflective index material on the cured embossed varnish and a metallic layer on the layer of the transparent high reflective index material.

The metallic ink may be applied to the substrate by means of conventional printing press such as gravure, rotogravure, flexographic, lithographic, offset, letterpress intaglio and/or screen process, or other printing process. The substrate may then be rewound for subsequent off line printing at a later stage or alternatively, the substrate may be pre-printed in line or off line or subsequently printed in line.

The metal-based ink may comprise metal pigment particles, a binder and optionally a colorant, such as a pigment, or dye, wherein pigments and dyes, which can be used for coloring the UV varnish, can also be used for colouring the metal-based ink.

The metal pigment particles may comprise any suitable metal. Nonlimiting examples of suitable metallic materials include aluminum, silver, copper, gold, platinum, tin, titanium, palladium, nickel, cobalt, rhodium, niobium, stainless steel, nichrome, chromium, and compounds, combinations or alloys thereof. The particles may comprise any one or more selected from the group comprising aluminium, gold, silver, platinum and copper. Preferably, the particles comprise aluminium, silver and/or copper flakes.

The metallic ink may be prepared by any means known to the skilled man. Preferably, a 12-micron thick transparent carrier film such as Polythyleneterephthalate obtained from DuPont Films Wilmington. Del. (Product ID Melinex HS-2) two meters wide is gravure coated with an acrylic resin isobutyl methacrylate obtained from DuPont (Product ID Elvacite 2045) and dried by means of hot air. In a second operation the acrylic-coated film is deposition coated with aluminium by means of a roll to roll vacuum chamber. The deposition rate and thickness of the vaporised aluminium layer over the printed acrylic coating is accurately controlled through continuos monitoring of the optical density during manufacture. The operating range of vacuum deposition may be in the range of 50 to 500 angstroms thick, the preferred thickness is in the range of 80 to 210 angstroms thick.

Preferably, the thickness of the pigment particles is less than 50 nm. More preferably, the thickness of pigment particle is less than 35 nm. More preferably still, the thickness of pigment particle is less than 20 nm. Even more preferably still, the thickness of pigment particle is in the range 5-18 nm.

The optical density may be in the range of 0.046 to 1, especially 0.09 to 0.8 as measured on the McBeth densitomiter. In another embodiment the range is 0.2 to 0.8, especially 0.5 to 0.8 as measured on the McBeth densitomiter.

The metal layer may comprise aluminium, stainless steel, nichrome, gold, silver, platinum or any other metal which can be vaporised and deposited by vacuum deposition or applied by sputtering or electron beam deposition. Preferably, the metal layer comprises aluminium.

The aluminium layer may be removed from the carrier film by means of dissolving the acrylic supporting layer in a bath containing ethyl acetate releasing the aluminium layer from the carrier film. The resulting aluminium in the form of a coarse flake in the resin solution may then be washed in a multi stage centrifuging process to remove the acrylic resin. The coarse aluminium flakes are mixed with ethyl acetate and disintegrated by a high shear mixing process to produce a controlled particle size distribution. The average particle diameter may be in the range of 8 to 15 microns, the preferred range being 9 to 10 microns diameter as measured by a Coulter LS130 l.a.s.e.r. diffraction granulometer.

In order that the sub-microscopic or holographic diffraction grating pattern or image (OVI) is clearly visible on both the first and second surface of a clear filmic substrate and the first surface of a paper substrate, preferably, the aluminium or other flakes are printed in such a way as to align themselves with the contours of the sub-microscopic, holographic or other diffraction grating pattern or image surface wave length such that the flakes conform to and follow the contours of the diffraction grating.

To accomplish this alignment of flakes to the contours of the diffraction grating wave length i.e. the distance between peak and peak or trough and trough of the sub-microscopic contour, the specifically formulated metallic ink preferably has a very low binder content, high pigment to binder ratio and very thin aluminium flake, preferably in the range of 9 to 10 microns, consistent to maintain good adhesion of the ink to the surface to the sub-microscopic or holographic diffraction pattern or image.

The binder may comprise any one or more selected from the group comprising nitro cellulose, vinyl chloride, vinyl acetate copolymers, vinyl, acrylic, urethane, polythylene-terephthalate, terpene phenol, polyolefin, silicone, cellulose, polyamide, rosin ester resins. The preferred binder is 50% nitrocellulose (ID nitrocellulose DHL120/170 and nitrocellulose DLX30/50 supplied by Nobel Industries) 50% polyurethane (ID Neorez U335 supplied by Avecia). The solvents may be ester/alcohol blends and preferably normal propyl acetate and ethanol in a ratio of 20:1 to 30:1.

Preferably, the pigment to binder ratio is in the range of 5:1 to 0.5:1 by weight. More preferably, the pigment to binder ratio is by weight in the range of 4:1 to 1:1. Even more preferably the pigment to binder ratio is in the range of 1.5:1 to 3.0:1 by weight, most preferably 2.5:1 by weight.

The metal pigment content by weight of the composition may be less than 10%. Preferably the pigment content by weight of the composition is less than 6%, more preferably in the range of 0.1% to 6%, even more preferably in the range 0.1% to 3%, more preferably still in the range 0.2% to 2% by weight. In another embodiment of the present invention the metal pigment content of the ink may be the range of 2% to 4% by weight, and preferably 3%.

An example of a metallic ink suitable for use in the methods and apparatus of the present invention is disclosed in WO05/051675, WO2005049745 and PCT/EP2009/066659.

The ink comprises, as in the case of an ordinary printing ink, the metal flakes, especially aluminium flakes, a binder, an auxiliary agent, and the like.

With respect to the binder resin, a thermoplastic resin may be used, examples of which include, polyethylene based polymers [polyethylene (PE), ethylene-vinyl acetate copolymer (EVA), vinyl chloride-vinyl acetate copolymer, vinyl alcohol-vinyl acetate copolymer, polypropylene (PP), vinyl based polymers [poly(vinyl chloride) (PVC), poly(vinyl butyral) (PVB), poly(vinyl alcohol) (PVA), poly(vinylidene chloride) (PVdC), poly(vinyl acetate) (PVAc), poly(vinyl formal) (PVF)], polystyrene based polymers [polystyrene (PS), styreneacrylonitrile copolymer (AS), acrylonitrile-butadiene-styrene copolymer (ABS)], acrylic based polymers [poly (methyl methacrylate) (PMMA), MMA-styrene copolymer], polycarbonate (PC), celluloses [ethyl cellulose (EC), cellulose acetate (CA), propyl cellulose (CP), cellulose acetate butyrate (CAB), cellulose nitrate (CN)], fluorin based polymers [polychlorofluoroethylene (PCTFE), polytetrafluoroethylene (PTFE), tetrafluoroethylene-hexafluoroethylene copolymer (FEP), poly(vinylidene fluoride) (PVdF)], urethane based polymers (PU), nylons [type 6, type 66, type 610, type 11], polyesters (alkyl) [polyethylene terephthalate (PET), polybutylene terephthalate (PBT), polycyclohexane terephthalate (PCT)], novolac type phenolic resins, or the like. In addition, thermosetting resins such as resol type phenolic resin, a urea resin, a melamine resin, a polyurethane resin, an epoxy resin, an unsaturated polyester and the like, and natural resins such as protein, gum, shellac, copal, starch and rosin may also be used.

Furthermore, to the binder, a plasticizer for stabilizing the flexibility and strength of the print film and a solvent for adjusting the viscosity and drying property thereof may be added according to the needs therefor. The solvent may comprise any one or more of an ester, such as n-propyl acetate, iso-propyl acetate, ethyl acetate, butyl acetate; an alcohol, such as ethyl alcohol, industrial methylated spirits, isopropyl alcohol or normal propyl alcohol; a ketone, such as methyl ethyl ketone or acetone; an aromatic hydrocarbon, such as xylene and toluene. A solvent of a low boiling temperature of about 100° C. and a petroleum solvent of a high boiling temperature of 250° C. or higher, may be used according to the type of the printing method. An alkylbenzene or the like, for example may be used as a solvent of a low boiling temperature. Examples of solvents are ethoxypropanol, methylethylketon, methoxypropylacetate, diacetonalcohol etc.

Further in addition, an auxiliary agent including a variety of reactive agents for improving drying property, viscosity, and dispersibility, may suitably be added. The auxiliary agents are to adjust the performance of the ink, and for example, a compound that improves the abrasion resistance of the ink surface and a drying agent that accelerates the drying of the ink, and the like may be employed.

A photopolymerization-curable resin or an electron beam curable resin wherein a solvent is not used may also be employed as a binder resin that is a principal component of the vehicle. The examples thereof include an acrylic resin, and specific examples of acrylic monomers commercially available are shown below.

A monofunctional acrylate monomer that may be used includes for example, 2-ethylhexyl acrylate, 2-ethylhexyl-EO adduct acrylate, ethoxydiethylene glycol acrylate, 2-hydroxyethyl acrylate, 2-hydroxypropyl acrylate, 2-hydroxyethyl acrylate-caprolactone adduct, 2-phenoxyethyl acrylate, phenoxydiethylene glycol acrylate, nonyl phenol-EO adduct acrylate, (nonyl phenol-EO adduct)-caprolactone adduct acrylate, 2-hydroxy-3-phenoxypropyl acrylate, tetrahydrofurfuryl acrylate, furfuryl alcohol-caprolactone adduct acrylate, acryloyl morpholine, dicyclopentenyl acrylate, dicyclopentanyl acrylate, dicyclopentenyloxyethyl acrylate, isobornyl acrylate, (4,4-dimethyl-1,3-dioxane)-caprolactone adduct acrylate, (3-methyl-5,5-dimethyl-1,3-dioxane)-caprolactone adduct acrylate, and the like.

A polyfunctional acrylate monomer that may be used includes hexanediol diacrylate, neopentyl glycol diacrylate, polyethylene glycol diacrylate, tripropylene glycol diacrylate, neopentyl glycol hydroxypivalate diacrylate, (neopentyl glycol hydroxypivalate)-caprolactone adduct diacrylate, (1,6-hexanediol diglycidyl ether)-acrylic acid adduct, (hydroxypivalaldehyde-trimethylolpropane acetal)diacrylate, 2,2-bis[4-(acryloyloxydiethoxy)phenyl]propane, 2,2-bis[4-(acryloyloxydiethoxy)phenyl]methane, hydrogenated bisphenol A-ethylene oxide adduct diacrylate, tricyclodecanedimethanol diacrylate, trimethylolpropane triacrylate, pentaerithritol triacrylate, (trimethylolpropane-propylene oxide) adduct triacrylate, glycerinepropylene oxide adduct triacrylate, a mixture of dipentaerithritol hexaacrylate and pentaacrylate, esters of dipentaerithritol and lower fatty acid and acrylic acid, dipentaerithritolcaprolactone adduct acrylate, tris(acryloyloxyethyl)isocyanurate, 2-acryloyloxyethyl phosphate, and the like.

Inks comprising the above resins are free of solvent and are so constituted as to polymerize in chain reaction upon irradiation by an electron beam or electromagnetic waves.

With respect to inks of ultraviolet-irradiation type among these inks, a photopolymerization initiator, and depending on the needs therefor, a sensitizing agent, and auxiliary agents such as a polymerization inhibitor and a chain transfer agent, and the like may be added thereto.

With respect to photo-polymerization initiators, there are, (1) an initiator of direct photolysis type including an arylalkyl ketone, an oxime ketone, an acylphosphine oxide, or the like, (2) an initiator of radical polymerization reaction type including a benzophenone derivative, a thioxanthone derivative, or the like, (3) an initiator of cationic polymerization reaction type including an aryl diazonium salt, an aryl iodinium salt, an aryl sulfonium salt, and an aryl acetophenone salt, or the like, and in addition, (4) an initiator of energy transfer type, (5) an initiator of photoredox type, (6) an initiator of electron transfer type, and the like. With respect to the inks of electron beam-curable type, a photopolymerization initiator is not necessary and a resin of the same type as in the case of the ultraviolet-irradiation type inks can be used, and various kinds of auxiliary agent may be added thereto according to the needs therefor.

The inks comprise a total content of aluminum pigment of from 0.1 to 20% by weight, preferably 0.1-10% by weight based on the total weight of the ink.

Preferably, the thickness of the metallic ink when deposited on a substrate is sufficiently thin as to permit the transmission of light therethrough. Consequently, the metallic ink may be printed on the substrate over a sub-microscopic or holographic diffraction grating pattern or image, such that the diffraction grating pattern or image may be visible through both the upper and lower surface of the substrate.

Preferably, when the substrate carrying the metallised image or pattern is subsequently over-laid onto printed pictures and/or text, or the substrate is pre-printed with pictures and/or text and the metallised image or pattern is deposited thereon those printed features are visible through the substrate and/or the metallic ink coated optically variable image or device.

Preferably, the thickness of the metallised image or optically variable device is such as to provide an optical density in the range of light transmission. Optical densities of the layer of metallic ink can be measured by the Macbeth Densitometer set out in the following table:

| Macbeth Optical Density Units | Percent Transmission |
|---|---|
| 0.10 | 79.43 |
| 0.20 | 63.10 |
| 0.30 | 50.12 |

-continued

| Macbeth Optical Density Units | Percent Transmission |
|---|---|
| 0.40 | 39.81 |
| 0.50 | 31.61 |
| 0.70 | 20.00 |
| 0.80 | 15.80 |
| 1 | 10.00 |

In a preferred embodiment of the present invention the percentage of light transmission is at least 30%, preferably at least 50%, more preferably at least 80%.

The forming of an optically variable image on the substrate may comprise depositing a curable compound, or composition on at least a portion of the substrate. The composition, generally a coating or lacquer may be deposited by means of gravure, flexographic, ink jet and screen process printing. The curable lacquer may be cured by actinic radiations, preferably ultraviolet (U.V.) light or electron beam. Preferably, the lacquer is UV cured. UV curing lacquers can be obtained from BASF SE. The lacquers exposed to actinic radiations or electron beam used in the present invention are required to reach a solidified stage when they separate again from the imaging shim in order to keep the record in their upper layer of the sub-microscopic, holographic diffraction grating image or pattern (OVI). Particularly suitable for the lacquers compositions are chemistries used in the radiation curable industries in industrial coatings and graphic arts. Particularly suitable are compositions containing one or several photo-latent catalysts that will initiate polymerization of the exposed lacquer layer to actinic radiations. Particularly suitable for fast curing and conversion to a solid state are compositions comprising one or several monomers and oligomers sensitive to free-radical polymerization, such as acrylates, methacrylates or monomers or/and oligomers, containing at least one ethylenically unsaturated group.

The unsaturated compounds may include one or more olefinic double bonds. They may be of low (monomeric) or high (oligomeric) molecular mass. Examples of monomers containing a double bond are alkyl, hydroxyalkyl or amino acrylates, or alkyl, hydroxyalkyl or amino methacrylates, for example methyl, ethyl, butyl, 2-ethylhexyl or 2-hydroxyethyl acrylate, isobornyl acrylate, methyl methacrylate or ethyl methacrylate. Silicone acrylates are also advantageous. Other examples are acrylonitrile, acrylamide, methacrylamide, N-substituted (meth)acrylamides, vinyl esters such as vinyl acetate, vinyl ethers such as isobutyl vinyl ether, styrene, alkyl- and halostyrenes, N-vinylpyrrolidone, vinyl chloride or vinylidene chloride.

Examples of monomers containing two or more double bonds are the diacrylates of ethylene glycol, propylene glycol, neopentyl glycol, hexamethylene glycol or of bisphenol A, and 4,4'-bis(2-acryl-oyloxyethoxy)diphenylpropane, trimethylolpropane triacrylate, pentaerythritol triacrylate or tetraacrylate, vinyl acrylate, divinylbenzene, divinyl succinate, diallyl phthalate, triallyl phosphate, triallyl isocyanurate or tris(2-acryloylethyl) isocyanurate.

Examples of polyunsaturated compounds of relatively high molecular mass (oligomers) are acrylated epoxy resins, polyesters containing acrylate-, vinyl ether- or epoxy-groups, and also polyurethanes and polyethers. Further examples of unsaturated oligomers are unsaturated polyester resins, which are usually prepared from maleic acid, phthalic acid and one or more diols and have molecular weights of from about 500 to 3000. In addition it is also possible to employ vinyl ether monomers and oligomers, and also maleate-terminated oligomers with polyester, polyurethane, polyether, polyvinyl ether and epoxy main chains. Of particular suitability are combinations of oligomers which carry vinyl ether groups and of polymers as described in WO90/01512. However, copolymers of vinyl ether and maleic acid-functionalized monomers are also suitable. Unsaturated oligomers of this kind can also be referred to as prepolymers.

Particularly suitable examples are esters of ethylenically unsaturated carboxylic acids and polyols or polyepoxides, and polymers having ethylenically unsaturated groups in the chain or in side groups, for example unsaturated polyesters, polyamides and polyurethanes and copolymers thereof, polymers and copolymers containing (meth)acrylic groups in side chains, and also mixtures of one or more such polymers.

Examples of unsaturated carboxylic acids are acrylic acid, methacrylic acid, crotonic acid, itaconic acid, cinnamic acid, and unsaturated fatty acids such as linolenic acid or oleic acid. Acrylic and methacrylic acid are preferred.

Suitable polyols are aromatic and, in particular, aliphatic and cycloaliphatic polyols. Examples of aromatic polyols are hydroquinone, 4,4'-dihydroxydiphenyl, 2,2-di(4-hydroxyphenyl)propane, and also novolaks and resols. Examples of polyepoxides are those based on the abovementioned polyols, especially the aromatic polyols, and epichlorohydrin. Other suitable polyols are polymers and copolymers containing hydroxyl groups in the polymer chain or in side groups, examples being polyvinyl alcohol and copolymers thereof or polyhydroxyalkyl methacrylates or copolymers thereof. Further polyols which are suitable are oligoesters having hydroxyl end groups.

Examples of aliphatic and cycloaliphatic polyols are alkylenediols having preferably 2 to 12 C atoms, such as ethylene glycol, 1,2- or 1,3-propanediol, 1,2-, 1,3- or 1,4-butanediol, pentanediol, hexanediol, octanediol, dodecanediol, diethylene glycol, triethylene glycol, polyethylene glycols having molecular weights of preferably from 200 to 1500, 1,3-cyclopentanediol, 1,2-, 1,3- or 1,4-cyclohexanediol, 1,4-dihydroxymethylcyclohexane, glycerol, tris(β-hydroxyethyl)amine, trimethylolethane, trimethylolpropane, pentaerythritol, dipentaerythritol and sorbitol.

The polyols may be partially or completely esterified with one carboxylic acid or with different unsaturated carboxylic acids, and in partial esters the free hydroxyl groups may be modified, for example etherified or esterified with other carboxylic acids.

Examples of esters are: trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol tris-itaconate, dipentaerythritol pentaitaconate, dipentaerythritol hexaitaconate, ethylene glycol diacrylate, 1,3-butanediol diacrylate, 1,3-butanediol dimethacrylate, 1,4-butanediol diitaconate, sorbitol triacrylate, sorbitol tetraacrylate, pentaerythritol-modified triacrylate, sorbitol tetra methacrylate, sorbitol pentaacrylate, sorbitol hexaacrylate, oligoester acrylates and methacrylates, glycerol diacrylate and triacrylate, 1,4-cyclohexane diacrylate, bisacrylates and bismethacrylates of polyethylene glycol with a molecular weight of from 200 to 1500, or mixtures thereof.

Also suitable as polymerizable components are the amides of identical or different, unsaturated carboxylic acids with aromatic, cycloaliphatic and aliphatic polyamines having preferably 2 to 6, especially 2 to 4, amino groups. Examples of such polyamines are ethylenediamine, 1,2- or 1,3-propylenediamine, 1,2-, 1,3- or 1,4-butylenediamine, 1,5-pentylenediamine, 1,6-hexylenediamine, octylenediamine, dodecylenediamine, 1,4-diaminocyclohexane, isophoronediamine, phenylenediamine, bisphenylenediamine, di-β-aminoethyl ether, diethylenetriamine, triethylenetetramine, di(β-aminoethoxy)- or di(β-aminopropoxy)ethane. Other suitable polyamines are polymers and copolymers, preferably with additional amino groups in the side chain, and oligoamides having amino end groups. Examples of such unsaturated amides are methylenebisacrylamide, 1,6-hexamethylenebisacrylamide, diethylenetriaminetrismethacrylamide, bis(methacrylamidopropoxy)ethane, β-methacrylamidoethyl methacrylate and N[(β-hydroxyethoxy)ethyl]acrylamide.

Suitable unsaturated polyesters and polyamides are derived, for example, from maleic acid and from diols or diamines. Some of the maleic acid can be replaced by other dicarboxylic acids. They can be used together with ethylenically unsaturated comonomers, for example styrene. The polyesters and polyamides may also be derived from dicarboxylic acids and from ethylenically unsaturated diols or diamines, especially from those with relatively long chains of, for example 6 to 20 C atoms. Examples of polyurethanes are those composed of saturated or unsaturated diisocyanates and of unsaturated or, respectively, saturated diols.

Polymers with (meth)acrylate groups in the side chain are likewise known. They may, for example, be reaction products of epoxy resins based on novolaks with (meth)acrylic acid, or may be homo- or copolymers of vinyl alcohol or hydroxyalkyl derivatives thereof which are esterified with (meth)acrylic acid, or may be homo- and copolymers of (meth)acrylates which are esterified with hydroxyalkyl (meth)acrylates.

Other suitable polymers with acrylate or methacrylate groups in the side chains are, for example, solvent soluble or alkaline soluble polyimide precursors, for example poly(amic acid ester) compounds, having the photopolymerizable side groups either attached to the backbone or to the ester groups in the molecule, i.e. according to EP624826. Such oligomers or polymers can be formulated with optionally reactive diluents, like polyfunctional (meth)acrylates in order to prepare highly sensitive polyimide precursor resists.

Examples of polymerizable component are also polymers or oligomers having at least two ethylenically unsaturated groups and at least one carboxyl function within the molecule structure, such as a resin obtained by the reaction of a saturated or unsaturated polybasic acid anhy-dride with a product of the reaction of an epoxy compound and an unsaturated monocarboxylic acid, for example, photosensitive compounds as described in JP 10-301276 and commercial products such as for example EB9696, UCB Chemicals; KAYARAD TCR1025, Nippon Kayaku Co., LTD., NK OLIGO EA-6340, EA-7440 from Shin-Nakamura Chemical Co., Ltd., or an addition product formed between a carboxyl group-containing resin and an unsaturated compound having an α,β-unsaturated double bond and an epoxy group (for example, ACA200M, Daicel Industries, Ltd.). Additional commercial products as examples of polymerizable component are ACA200, ACA210P, ACA230AA, ACA250, ACA300, ACA320 from Daicel Chemical Industries, Ltd.

The photopolymerizable compounds are used alone or in any desired mixtures. It is preferred to use mixtures of polyol (meth)acrylates.

A preferred composition comprises at least one compound having at least one free carboxylic group, said compound being either subject of component (a) or of a binder polymer.

As diluent, a mono- or multi-functional ethylenically unsaturated compound, or mixtures of several of said compounds, can be included in the above composition up to 70% by weight based on the solid portion of the composition.

The invention also provides compositions comprising as polymerizable component at least one ethylenically unsaturated photopolymerizable compound which is emulsified or dissolved in water.

The unsaturated polymerizable components can also be used in admixture with non-photopolymerizable, film-forming components. These may, for example, be physically drying polymers or solutions thereof in organic solvents, for instance nitrocellulose or cellulose acetobutyrate. They may also, however, be chemically and/or thermally curable (heat-curable) resins, examples being polyisocyanates, polyepoxides and melamine resins, as well as polyimide precursors. The use of heat-curable resins at the same time is important for use in systems known as hybrid systems, which in a first stage are photopolymerized and in a second stage are crosslinked by means of thermal aftertreatment.

A photoinitiator is incorporated into the formulation to initiate the UV-curing process. Photoinitiator compounds are for example described by Kurt Dietliker in "A compilation of photoinitiators commercially available for UV today", Sita Technology Ltd., Edinburgh and London, 2002, and by J. V. Crivello and K Dietliker in "Chemistry & Technology of UV & EB Formulation for Coatings, Inks and Paints; Photoinitiators for Free Radical, Cationic & Anionic Photopolymerization, Ed. 2, Vol. III, 1998, Sita Technology Ltd., London.

In certain cases it may be of advantage to use mixtures of two or more photoinitiators, for example mixtures with camphor quinone; benzophenone, benzophenone derivatives of the formula:

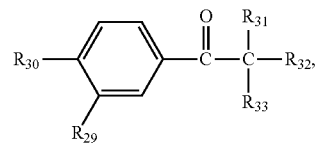

wherein
$R_{65}$, $R_{66}$ and $R_{67}$ independently of one another are hydrogen, $C_1$-$C_4$-alkyl, $C_1$-$C_4$-halogenalkyl, $C_1$-$C_4$-alkoxy, chlorine or $N(C_1$-$C_4$-alkyl$)_2$;
$R_{68}$ is hydrogen, $C_1$-$C_4$-alkyl, $C_1$-$C_4$-halogenalkyl, phenyl, $N(C_1$-$C_4$-alkyl$)_2$, COOCH$_3$,

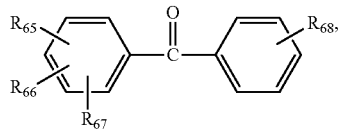

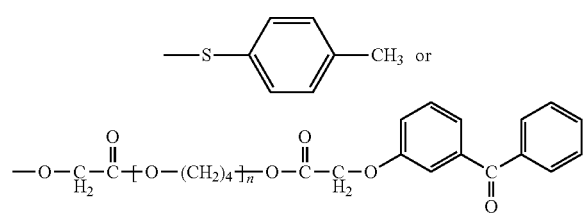

and
n is 2-10.

Specific examples are: 2,4,6-trimethylbenzophenone, 2-methylbenzophenone, 3-methylbenzophenone, 4-methylbenzophenone, 2-methoxycarbonylbenzophenone 4,4'-bis (chloromethyl)benzophenone, 4-chlorobenzophenone, 4-phenylbenzophenone, 3,3'-dimethyl-4-methoxy-benzophenone, [4-(4-methylphenylthio)phenyl]-phenylmethanone, methyl-2-benzoylbenzoate, 3-methyl-4'-phenylbenzophenone, 2,4,6-trimethyl-4'-phenylbenzophenone, 4,4'-bis (dimethylamino)benzophenone, 4,4'-bis(diethylamino) benzophenone; ESACURE TZT® available from Lamberti, (a mixture of 2,4,6-trimethylbenzophenone and 4-methylbenzophenone);

Ketal compounds, as for example benzildimethylketal (IR-GACURE® 651); acetophenone, acetophenone derivatives, alpha-hydroxy ketones, alpha-alkoxyketones or alpha-aminoketones of the formula

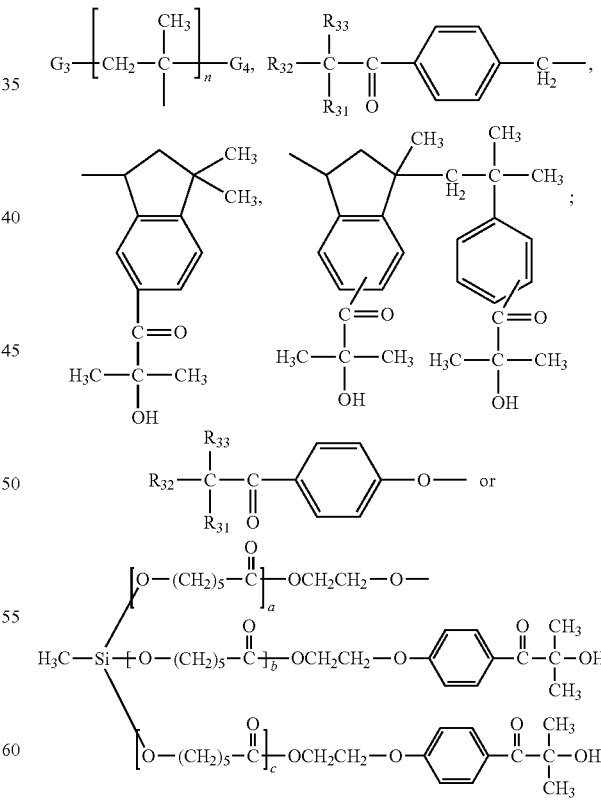

wherein
$R_{29}$ is hydrogen or $C_1$-$C_{18}$-alkoxy;
$R_{30}$ is hydrogen, $C_1$-$C_{18}$-alkyl, $C_1$-$C_{12}$hydroxyalkyl, $C_1$-$C_{18}$-alkoxy, —OCH$_2$CH$_2$—OR$_{47}$, morpholino, $C_1$-$C_{18}$alkyl-S—, a group H$_2$C=CH—, H$_2$C=C(CH$_3$)—, a, b and c are 1-3;
n is 2-10;
G$_3$ and G$_4$ independently of one another are end groups of the polymeric structure, preferably hydrogen or methyl;

$R_{47}$ is hydrogen,

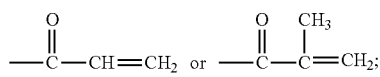

$R_{31}$ is hydroxy, $C_1$-$C_{16}$-alkoxy, morpholino, dimethylamino or —O(CH$_2$CH$_2$O)$_m$—$C_1$-$C_{16}$-alkyl;

$R_{32}$ and $R_{33}$ independently of one another are hydrogen, $C_1$-$C_6$-alkyl, $C_1$-$C_{16}$-alkoxy or —O(CH$_2$CH$_2$O)$_m$—$C_1$-$C_{16}$-alkyl; or unsubstituted phenyl or benzyl; or phenyl or benzyl substituted by $C_1$-$C_{12}$-alkyl; or R32 and $R_{33}$ together with the carbon atom to which they are attached form a cyclohexyl ring;

m is 1-20, with the proviso that $R_{31}$, $R_{32}$ and $R_{33}$ not all together are $C_1$-$C_{16}$-alkoxy or —O(CH$_2$CH$_2$O)$_m$—$C_1$-$C_{16}$-alkyl.

For example α-hydroxycycloalkyl phenyl ketones or α-hydroxyalkyl phenyl ketones, such as for example 2-hydroxy-2-methyl-1-phenyl-propanone (DAROCUR® 1173), 1-hydroxycyclohexyl-phenyl-ketone (IRGACURE® 184), IRGACURE® 500 (a mixture of IR-GACURE® 184 with benzophenone), 1-(4-dodecylbenzoyl)-1-hydroxy-1-methyl-ethane, 1-(4-isopropylbenzoyl)-1-hydroxy-1-methyl-ethane, 1-[4-(2-hydroxyethoxy)-phenyl]-2-hydroxy-2-methyl-1-propan-1-one (IRGACURE®2959); 2-hydroxy-1-{4-[4-(2-hydroxy-2-methyl-propionyl)-benzyl]-phenyl}-2-methyl-propan-1-one (IRGACURE®127); 2-Benzyl-1-(3,4-dimethoxy-phenyl)-2-dimethylamino-butan-1-one; 2-Hydroxy-1-{4-[4-(2-hydroxy-2-methyl-propionyl)-phenoxy]-phenyl}-2-methyl-propan-1-one,

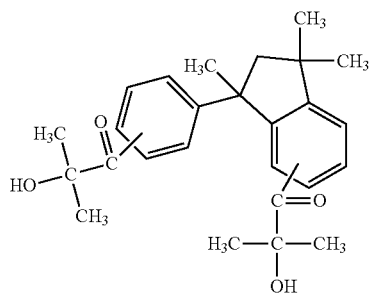

ESACURE KIP and ONE provided by Fratelli Lamberti, 2-hydroxy-1-{1-[4-(2-hydroxy-2-methyl-propionyl)-phenyl]-1,3,3-trimethyl-indan-5-yl}-2-methyl-propan-1-one dialkoxyacetophenones, α-hydroxy- or α-aminoacetophenones, e.g. (4-methylthiobenzoyl)-1-methyl-1-morpholinoethane (IRGACURE® 907), (4-morpholinobenzoyl)-1-benzyl-1-dimethylaminopropane (IRGACURE® 369), (4-morpholinobenzoyl)-1-(4-methylbenzyl)-1-dimethylaminopropane (IRGACURE® 379), (4-(2-hydroxyethyl)aminobenzoyl)-1-benzyl-1-dimethylaminopropane), 2-benzyl-2-dimethylamino-1-(3,4-dimethoxyphenyl)butanone-1;

4-aroyl-1,3-dioxolanes, benzoin alkyl ethers and benzil ketals, e.g. dimethyl benzil ketal, phenylglyoxalic esters and derivatives thereof, e.g. oxo-phenyl-acetic acid 2-(2-hydroxyethoxy)-ethyl ester, dimeric phenylglyoxalic esters, e.g. oxo-phenyl-acetic acid 1-methyl-2-[2-(2-oxo-2-phenyl-acetoxy)-propoxy]-ethyl ester (IRGACURE® 754); oximeesters, e.g. 1,2-octanedione 1-[4-(phenylhio)phenyl]-2-(O-benzoyloxime) (IRGACURE® OXE01), ethanone 1-[9-ethyl-6-(2-methylenzoyl)-9H-carbazol-3-yl]-1-(O-acetyloxime) (IR-GACURE® OXE02), 9H-thioxanthene-2-carboxaldehyde 9-oxo-2-(O-acetyloxime), peresters, e.g. benzophenone tetracarboxylic peresters as described for example in EP 126541, monoacyl phosphine oxides, e.g. (2,4,6-trimethylbenzoyl)diphenylphosphine oxide (DAROCUR® TPO), ethyl (2,4,6 trimethylbenzoyl phenyl) phosphinic acid ester; bisacyl-phosphine oxides, e.g. bis(2,6-dimethoxy-benzoyl)-(2,4,4-trimethyl-pentyl)phosphine oxide, bis(2,4,6-trimethylbenzoyl)-phenylphosphine oxide (IRGACURE® 819), bis(2,4,6-trimethylbenzoyl)-2,4-dipentoxyphenylphosphine oxide, trisacylphosphine oxides, halomethyltriazines, e.g. 2-[2-(4-methoxy-phenyl)-vinyl]-4,6-bis-trihlorothyl-[1,3,5]triazine, 2-(4-methoxy-phenyl)-4,6-bis-trichloromethyl-[1,3,5]triazine, 2-(3,4-dimethoxy-phenyl)-4,6-bis-trichloromethyl-[1,3,5]triazine, 2-methyl-4,6-bis-trichloromethyl-[1,3,5]triazine, hexaaryl-bisimidazole/coinitiators systems, e.g. ortho-chlorohexaphenyl-bisimidazole combined with 2-mercaptobenzthiazole, ferrocenium compounds, or titanocenes, e.g. bis(cyclopentadienyl)-bis(2,6-difluoro-3-pyrryl-phenyl)titanium (IRGACURE®784). Further, borate compounds can be used as coinitiators.

Phenylglyoxalates of the formula

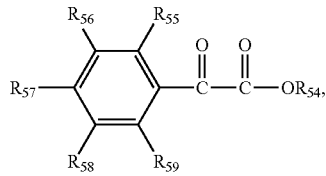

wherein $R_{54}$ is hydrogen, $C_1$-$C_{12}$-alkyl or

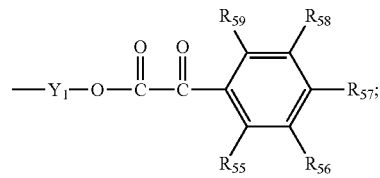

$R_{55}$, $R_{56}$, $R_{57}$, $R_{58}$ and $R_{59}$ independently of one another are hydrogen, unsubstituted $C_1$-$C_{12}$-alkyl or $C_1$-$C_{12}$-alkyl substituted by OH, $C_1$-$C_4$-alkoxy, phenyl, naphthyl, halogen or CN; wherein the alkyl chain optionally is interrupted by one or more oxygen atoms; or $R_{55}$, $R_{56}$, $R_{57}$, $R_{58}$ and $R_{59}$ independently of one another are $C_1$-$C_4$-alkoxy, $C_1$-$C_4$-alkythio or $NR_{52}R_{53}$;

$R_{52}$ and $R_{53}$ independently of one another are hydrogen, unsubstituted $C_1$-$C_{12}$-alkyl or $C_1$-$C_{12}$-alkyl substituted by OH or SH wherein the alkyl chain optionally is interrupted by one to four oxygen atoms; or $R_{52}$ and $R_{53}$ independently of one another are $C_2$-$C_{12}$-alkenyl, cyclopentyl, cyclohexyl, benzyl or phenyl; and $Y_1$ is $C_1$-$C_{12}$-alkylene optionally interrupted by one or more oxygen atoms.

An example is oxo-phenyl-acetic acid 2-[2-(2-oxo-2-phenyl-acetoxy)-ethoxy]-ethyl ester (IRGACURE®754). A further example of a photoinitiator is Esacure 1001 available from Lamberti: 1-[4-(4-benzoylphenylsulfanyl)phenyl]-2-methyl-2-(4-methylphenylsulfonyl)-propan-1-one

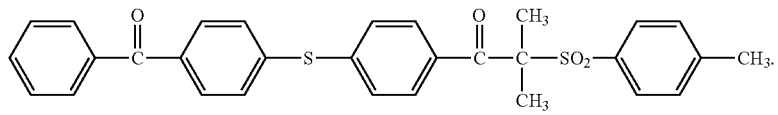 [SMILES: Cc1ccc(S(=O)(=O)C(C)(C)C(=O)c2ccc(Sc3ccc(C(=O)c4ccccc4)cc3)cc2)cc1]

The photopolymerizable compositions generally comprise 0.05 to 20% by weight, preferably 0.01 to 10% by weight, in particular 0.01 to 8% by weight of the photoinitiator, based on the solid composition. The amount refers to the sum of all photoinitiators added, if mixtures of initiators are employed.

In addition to the photoinitiator, the photopolymerisable mixtures can comprise various additives. Examples thereof include thermal inhibitors, light stabilisers, optical brighteners, fillers and pigments, as well as white and coloured pigments, dyes, antistatics, adhesion promoters, wetting agents, flow auxiliaries, lubricants, waxes, anti-adhesive agents, dispersants, emulsifiers, anti-oxidants; fillers, e.g. talcum, gypsum, silicic acid, rutile, carbon black, zinc oxide, iron oxides; reaction accelerators, thickeners, matting agents, antifoams, and other adjuvants customary, for example, in lacquer, ink and coating technology.

To accelerate the photopolymerization it is possible to add amines as additives, for example triethanolamine, N-methyldiethanolamine, ethyl-p-dimethylaminobenzoate, 2-(dimethylamino)ethyl benzoate, 2-ethylhexyl-p-dimethylaminobenzoate, octyl-para-N,N-dimethylaminobenzoate, N-(2-hydroxyethyl)-N-methyl-para-toluidine or Michler's ketone. The action of the amines can be intensified by the addition of aromatic ketones of the benzophenone type. Examples of amines which can be used as oxygen scavengers are substituted N,N-dialkylanilines, as are described in EP339841. Other accelerators, coinitiators and autoxidizers are thiols, thioethers, disulfides, phosphonium salts, phosphine oxides or phosphines, as described, for example, in EP438123, in GB2180358 and in JP Kokai Hei 6-68309.

Photopolymerization can also be accelerated by adding further photosensitizers or coinitiators (as additive) which shift or broaden the spectral sensitivity. These are, in particular, aromatic compounds, for example benzophenone and derivatives thereof, thioxanthone and derivatives thereof, anthraquinone and derivatives thereof, coumarin and phenothiazine and derivatives thereof, and also 3-(aroylmethylene)thiazolines, rhodanine, camphorquinone, but also eosine, rhodamine, erythrosine, xanthene, thioxanthene, acridine, e.g. 9-phenylacridine, 1,7-bis(9-acridinyl)heptane, 1,5-bis(9-acridinyl)pentane, cyanine and merocyanine dyes.

As photosensitizers, it is also possible, for example, to consider the amines given above. Examples of suitable sensitizers are disclosed in WO06/008251, page 36, line 30 to page 38, line 8, the disclosure of which is hereby incorporated by reference.

Binders as well can be added to the novel compositions. This is particularly expedient when the photopolymerizable compounds are liquid or viscous substances. The quantity of binder may, for example, be 2-98%, preferably 5-95% and especially 20-90%, by weight relative to the overall solids content. The choice of binder is made depending on the field of application and on properties required for this field, such as the capacity for development in aqueous and organic solvent systems, adhesion to substrates and sensitivity to oxygen. Examples of suitable binders are polymers having a molecular weight of about 2,000 to 2,000,000, preferably 5,000 to 1,000,000.

Examples of alkali developable binders are acrylic polymer having carboxylic acid function as a pendant group, such as conventionally known copolymers obtained by copolymerizing an ethylenic unsaturated carboxylic acid such as (meth)acrylic acid, 2-carboxyethyl (meth)acrylic acid, 2-carboxypropyl (meth)acrylic acid itaconic acid, crotonic acid, maleic acid, fumaric acid, ω-carboxypolycaprolactone mono (meth)acrylate, with one or more monomers selected from esters of (meth)acrylic acid, such as methyl (meth)acrylate, ethyl (meth)acrylate, propyl (meth)acrylate, butyl (meth)acrylate, benzyl (meth)acrylate, 2-ethylhexyl (meth)acrylate, hydroxyethyl (meth)acrylate, hydroxypropyl (meth)acrylate, glycerol mono(meth)acrylate, tricyclo[5.2.1.0$^{2,6}$]decan-8-yl (meth)acrylate, glycidyl (meth)acrylate, 2-methylglycidyl (meth)acrylate, 3,4-epoxybutyl (meth)acrylate, 6,7-epoxyheptyl (meth)acrylate, N,N-dimethylaminoethyl (meth)acrylate, N,N-diethylaminoethyl (meth)acrylate, N,N-diethylaminoethyl (meth)acrylate, N,N-dimethylaminopropyl (meth)acrylate; vinyl aromatic compounds, such as styrene, α-methylstyrene, vinyltoluene, p-chlorostyrene, vinylbenzyl glycidyl ether, 4-vinylpyridine; amide type unsaturated compounds, (meth)acrylamide diacetone acrylamide, N-methylolacrylamide, N-butoxymethacrylamide N,N-dimethylacrylamide, N,N-dimethylaminopropyl (meth)acrylamide; and polyolefin type compounds, such as butadiene, isoprene, chloroprene and the like; methacrylonitrile, methyl isopropenyl ketone, mono-2-[(meth)acryloyloxy]ethyl succinate, N-phenylmaleimide, maleic anhydride, vinyl acetate, vinyl propionate, vinyl pivalate, vinylpyrrolidone, N,N-dimethylaminoethyl vinyl ether, diallylamine, polystyrene macromonomer, or polymethyl (meth)acrylate macromonomer. Examples of copolymers are copolymers of acrylates and methacrylates with acrylic acid or methacrylic acid and with styrene or substituted styrene, phenolic resins, for example novolak, (poly)hydroxystyrene, and copolymers of hydroxystyrene with alkyl acrylates, acrylic acid and/or methacrylic acid. Preferable examples of copolymers are copolymers of methyl methacrylate/methacrylic acid, copolymers of benzyl methacrylate/methacrylic acid, copolymers of methyl methacrylate/ethyl acrylate/methacrylic acid, copolymers of benzyl methacrylate/methacrylic acid/styrene, copolymers of benzyl methacrylate/methacrylic acid/hydroxyethyl methacrylate, copolymers of methyl methacrylate/butyl methacrylate/methacrylic acid/styrene, copolymers of methyl methacrylate/benzyl methacrylate/methacrylic acid/hydroxyphenyl methacrylate. Examples of solvent developable binder polymers are poly(alkyl methacrylates), poly(alkyl acrylates), poly(benzylmethacrylate-co-hydroxyethylmethacrylate-co-methacrylic acid), poly(benzylmethacrylate-co-methacrylic acid); cellulose esters and cellulose ethers, such as cellulose acetate, cellulose acetobutyrate, methylcellulose, ethylcellulose; polyvinylbutyral, polyvinylformal, cyclized rubber, polyethers such as polyethylene oxide, polypropylene oxide and polytetrahydrofuran; polystyrene, polycarbonate, polyurethane, chlorinated polyolefins, polyvinyl chloride, vinyl chloride/vinylidene copolymers, copolymers of vinylidene chloride with acrylonitrile, methyl methacrylate and vinyl acetate, polyvinyl acetate, copoly-(ethylene/vinyl acetate), polymers such as polycaprolactam and poly(hexamethylene adipamide), and polyesters such as poly(ethylene glycol terephtalate) and poly(hexamethylene glycol succinate) and polyimide binder resins.

The polyimide binder resin can either be a solvent soluble polyimide or a polyimide precursor, for example, a poly(amic acid).

Interesting is a photopolymerizable composition, comprising as binder polymer, a copolymer of methacrylate and methacrylic acid. Interesting further are polymeric binder components as described e.g. in JP 10-171119-A.

"Dual curable" or "double curable" compositions can also be used in this application.

Previous compositions are efficiently cured by electron beam or in the presence of free-radical generating photoinitiators when irradiated with electromagnetic waves.

Particularly suitable for fast curing and conversion to a solid state are compositions comprising one or several monomers and oligomers sensitive to cationic polymerization, such as epoxy resins, glycidyl ethers, vinylethers, oxetanes or other monomers and oligomers that will homopolymerized or copolymerized in a cationic curable system.

Corresponding compositions comprise as polymerizable component, for example, resins and compounds that can be cationically polymerised by alkyl- or aryl-containing cations or by protons. Examples thereof include cyclic ethers, especially epoxides and oxetanes, and also vinyl ethers and hydroxy-containing compounds. Lactone compounds and cyclic thioethers as well as vinyl thioethers can also be used. Further examples include aminoplastics or phenolic resole resins. These are especially melamine, urea, epoxy, phenolic, acrylic, polyester and alkyd resins, but especially mixtures of acrylic, polyester or alkyd resins with a melamine resin. These include also modified surface-coating resins, such as, for example, acrylic-modified polyester and alkyd resins. Examples of individual types of resins that are included under the terms acrylic, polyester and alkyd resins are described, for example, in Wagner, Sarx/Lackkunstharze (Munich, 1971), pages 86 to 123 and 229 to 238, or in Ullmann/Encyclopädie der techn. Chemie, $4^{th}$ edition, volume 15 (1978), pages 613 to 628, or Ullmann's Encyclopedia of Industrial Chemistry, Verlag Chemie, 1991, Vol. 18, 360 ff., Vol. A19, 371 ff. The surface-coating preferably comprises an amino resin. Examples thereof include etherified and non-etherified melamine, urea, guanidine and biuret resins. Of special importance is acid catalysis for the curing of surface-coatings comprising etherified amino resins, such as, for example, methylated or butylated melamine resins (N-methoxymethyl- or N-butoxymethyl-melamine) or methylated/butylated glycolurils.

It is possible, for example, to use all customary epoxides, such as aromatic, aliphatic or cycloaliphatic epoxy resins. These are compounds having at least one, preferably at least two, epoxy group(s) in the molecule. Examples thereof are the glycidyl ethers and β-methyl glycidyl ethers of aliphatic or cycloaliphatic diols or polyols, e.g. those of ethylene glycol, propane-1,2-diol, propane-1,3-diol, butane-1,4-diol, diethylene glycol, polyethylene glycol, polypropylene glycol, glycerol, trimethylolpropane or 1,4-dimethylolcyclohexane or of 2,2-bis(4-hydroxycyclohexyl)propane and N,N-bis (2-hydroxyethyl)aniline; the glycidyl ethers of di- and polyphenols, for example of resorcinol, of 4,4'-dihydroxyphenyl-2,2-propane, of novolaks or of 1,1,2,2-tetrakis(4-hydroxyphenyl)ethane. Examples thereof include phenyl glycidyl ether, p-tert-butyl glycidyl ether, o-icresyl glycidyl ether, polytetrahydrofuran glycidyl ether, n-butyl glycidyl ether, 2-ethylhexylglycidylether, $C_{12/15}$alkyl glycidyl ether and cyclohexanedimethanol diglycidyl ether. Further examples include N-glycidyl compounds, for example the glycidyl compounds of ethyleneurea, 1,3-propyleneurea or 5-dimethylhydantoin or of 4,4'-methylene-5,5'-tetramethyldihydantoin, or compounds such as triglycidyl isocyanurate.

Further examples of glycidyl ether components that are used in these formulations are, for example, glycidyl ethers of polyhydric phenols obtained by the reaction of polyhydric phenols with an excess of chlorohydrin, such as, for example, epichlorohydrin (e.g. glycidyl ethers of 2,2-bis(2,3-epoxypropoxyphenol)propane. Further examples of glycidyl ether epoxides that can be used in connection with the present invention are described, for example, in U.S. Pat. No. 3,018,262 and in "Handbook of Epoxy Resins" by Lee and Neville, McGraw-Hill Book Co., New York (1967).

There is also a large number of commercially available glycidyl ether epoxides that are suitable as component, such as, for example, glycidyl methacrylate, diglycidyl ethers of bisphenol A, for example those obtainable under the trade names EPON 828, EPON 825, EPON 1004 and EPON 1010 (Shell); DER-331, DER-332 and DER-334 (Dow Chemical); 1,4-butanediol diglycidyl ethers of phenolformaldehyde novolak, e.g. DEN-431, DEN-438 (Dow Chemical); and resorcinol diglycidyl ethers; alkyl glycidyl ethers, such as, for example, $C_8$-$C_{10}$glycidyl ethers, e.g. HELOXY Modifier 7, $C_{12}$-$C_{14}$glycidyl ethers, e.g. HELOXY Modifier 8, butyl glycidyl ethers, e.g. HELOXY Modifier 61, cresyl glycidyl ethers, e.g. HELOXY Modifier 62, p-tert-butylphenyl glycidyl ethers, e.g. HELOXY Modifier 65, polyfunctional glycidyl ethers, such as diglycidyl ethers of 1,4-butanediol, e.g. HELOXY Modifier 67, diglycidyl ethers of neopentyl glycol, e.g. HELOXY Modifier 68, diglycidyl ethers of cyclohexanedimethanol, e.g. HELOXY Modifier 107, trimethylolethane triglycidyl ethers, e.g. HELOXY Modifier 44, trimethylolpropane triglycidyl ethers, e.g. HELOXY Modifier 48, polyglycidyl ethers of aliphatic polyols, e.g. HELOXY Modifier 84 (all HELOXY glycidyl ethers are obtainable from Shell).

Also suitable are glycidyl ethers that comprise copolymers of acrylic esters, such as, for example, styrene-glycidyl methacrylate or methyl methacrylate-glycidyl acrylate. Examples thereof include 1:1 styrene/glycidyl methacrylate, 1:1 methyl methacrylate/glycidyl acrylate, 62.5:24:13.5 methyl methacrylate/ethyl acrylate/glycidyl methacrylate.

The polymers of the glycidyl ether compounds can, for example, also comprise other functionalities provided that these do not impair the cationic curing.

Other suitable glycidyl ether compounds that are commercially available are polyfunctional liquid and solid novolak glycidyl ether resins, e.g. PY 307, EPN 1179, EPN 1180, EPN 1182 and ECN 9699.

It will be understood that mixtures of different glycidyl ether compounds may also be used as component.

The glycidyl ethers are, for example, compounds of formula XX

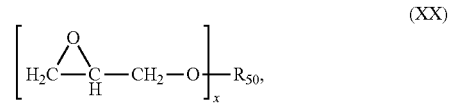

wherein
x is a number from 1 to 6; and
$R_{50}$ is a mono- to hexavalent alkyl or aryl radical.

Preference is given, for example, to glycidyl ether compounds of formula XX, wherein x is the number 1, 2 or 3; and $R_{50}$ when x=1, is unsubstituted or $C_1$-$C_{12}$alkyl-substituted phenyl, naphthyl, anthracyl, biphenylyl, $C_1$-$C_{20}$alkyl, or $C_2$-$C_{20}$alkyl interrupted by one or more oxygen atoms, or $R_{50}$ when x=2, is 1,3-phenylene, 1,4-phenylene, $C_6$-$C_{10}$cycloalkylene, unsubstituted or halo-substituted $C_1$-$C_{40}$alkylene, $C_2$-$C_{40}$alkylene interrupted by one or more oxygen atoms, or a group

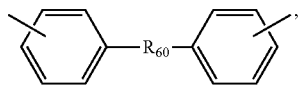

or $R_{50}$ when x=3, is a radical

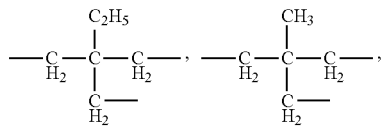

or

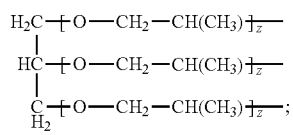

z is a number from 1 to 10; and $R_{60}$ is $C_1$-$C_{20}$alkylene, oxygen or

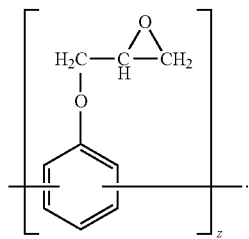

The glycidyl ethers (a1) are, for example, compounds of formula XXa

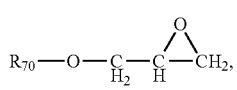

(XXa)

wherein $R_{70}$ is unsubstituted or $C_1$-$C_{12}$alkyl-substituted phenyl; naphthyl; anthracyl; biphenylyl; $C_1$-$C_{20}$alkyl, $C_2$-$C_{20}$alkyl interrupted by one or more oxygen atoms; or a group of formula

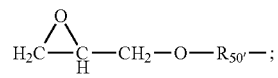

$R_{50'}$ is phenylene, $C_1$-$C_{20}$alkylene, $C_2$-$C_{20}$alkylene interrupted by one or more oxygen atoms, or a group

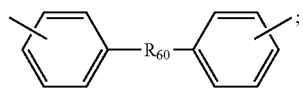

and $R_{60}$ is $C_1$-$C_{20}$alkylene or oxygen.

Preference is given to the glycidyl ether compounds of formula XXb

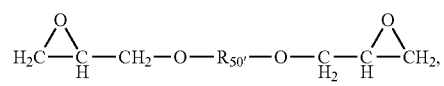

(XXb)

wherein $R_{50'}$ is phenylene, $C_1$-$C_{20}$alkylene, $C_2$-$C_{20}$alkylene interrupted by one or more oxygen atoms, or a group

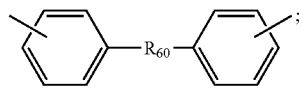

and $R_{60}$ is $C_1$-$C_{20}$alkylene or oxygen.

Further examples for polymerizable component are polyglycidyl ethers and poly(β-methylglycidyl)ethers obtainable by the reaction of a compound containing at least two free alcoholic and/or phenolic hydroxy groups per molecule with the appropriate epichlorohydrin under alkaline conditions, or alternatively in the presence of an acid catalyst with subsequent alkali treatment. Mixtures of different polyols may also be used.

Such ethers can be prepared with poly(epichlorohydrin) from acyclic alcohols, such as ethylene glycol, diethylene glycol and higher poly(oxyethylene)glycols, propane-1,2-diol and poly(oxypropylene)glycols, propane-1,3-diol, butane-1,4-diol, poly(oxytetramethylene)glycols, pentane-1,5-diol, hexane-1,6-diol, hexane-2,4,6-triol, glycerol, 1,1,1-trimethylol-propane, pentaerythritol and sorbitol, from cycloaliphatic alcohols, such as resorcitol, quinitol, bis(4-hydroxycyclohexyl)methane, 2,2-bis(4-hydroxycyclohexyl) propane and 1,1-bis(hydroxymethyl)cyclohex-3-ene, and from alcohols having aromatic nuclei, such as N,N-bis(2-hydroxyethyl)aniline and p,p'-bis(2-hydroxyethylamino) diphenylmethane. They can also be prepared from mononuclear phenols, such as resorcinol and hydroquinone, and polynuclear phenols, such as bis(4-hydroxyphenyl)methane, 4,4-dihydroxydiphenyl, bis(4-hydroxyphenyl)sulphone, 1,1,2,2-tetrakis(4-hydroxyphenyl)ethane, 2,2-bis(4-hydroxyphenyl)-propane (bisphenol A) and 2,2-bis(3,5-dibromo-4-hydroxyphenyl)propane. Further hydroxy compounds suitable for the preparation of polyglycidyl ethers and poly (β-methylglycidyl)ethers are the novolaks obtainable by the condensation of aldehydes, such as formaldehyde, acetaldehyde, chloral and furfural, with phenols, such as, for example, phenol, o-cresol, m-cresol, p-cresol, 3,5-dimethylphenol, 4-chlorophenol and 4-tert-butylphenol.

Poly(N-glycidyl) compounds can be obtained, for example, by dehydrochlorination of the reaction products of epichlorohydrin with amines containing at least two amino-hydrogen atoms, such as aniline, n-butylamine, bis(4-aminophenyl)methane, bis(4-aminophenyl)propane, bis(4-methylaminophenyl)methane and bis(4-aminophenyl)ether, sulphone and sulphoxide. Further suitable poly(N-glycidyl) compounds include triglycidyl isocyanurate, and N,N'-diglycidyl derivatives of cyclic alkyleneureas, such as ethyleneurea and 1,3-propyleneurea, and hydantoins, such as, for example, 5,5-dimethylhydantoin.

Poly(S-glycidyl) compounds are also suitable. Examples thereof include the di-S-glycidyl derivatives of dithiols, such as ethane-1,2-dithiol and bis(4-mercaptomethylphenyl)ether.

There also come into consideration epoxy resins in which the glycidyl groups or β-methyl glycidyl groups are bonded to hetero atoms of different types, for example the N,N,O-triglycidyl derivative of 4-aminophenol, the glycidyl ether/glycidyl ester of salicylic acid or p-hydroxybenzoic acid, N-glycidyl-N'-(2-glycidyloxypropyl)-5,5-dimethyl-hydantoin and 2-glycidyloxy-1,3-bis(5,5-dimethyl-1-glycidylhydantoin-3-yl)propane.

Preference is given to diglycidyl ethers of bisphenols. Examples thereof include diglycidyl ethers of bisphenol A, e.g. ARALDIT GY 250, diglycidyl ethers of bisphenol F and diglycidyl ethers of bisphenol S. Special preference is given to diglycidyl ethers of bisphenol A.

Further glycidyl compounds of technical importance are the glycidyl esters of carboxylic acids, especially di- and poly-carboxylic acids. Examples thereof are the glycidyl esters of succinic acid, adipic acid, azelaic acid, sebacic acid, phthalic acid, terephthalic acid, tetra- and hexa-hydrophthalic acid, isophthalic acid or trimellitic acid, or of dimerised fatty acids.

Examples of polyepoxides that are not glycidyl compounds are the epoxides of vinylcyclohexane and dicyclopentadiene, 3-(3',4'-epoxycyclohexyl)-8,9-epoxy-2,4-dioxaspiro-[5.5]undecane, the 3',4'-epoxycyclohexylmethyl esters of 3,4-epoxycyclohexanecarboxylic acid, (3,4-epoxycyclohexyl-methyl 3,4-epoxycyclohexanecarboxylate), butadiene diepoxide or isoprene diepoxide, epoxidised linoleic acid derivatives or epoxidised polybutadiene.

Further suitable epoxy compounds are, for example, limonene monoxide, epoxidised soybean oil, bisphenol-A and bisphenol-F epoxy resins, such as, for example, Araldit® GY 250 (A), ARALDIT®GY 282 (F), ARALDIT®GY 285 (F)), and photocurable siloxanes that contain epoxy groups.

Further suitable cationically polymerisable or crosslinkable components can be found, for example, also in U.S. Pat. No. 3,117,099, U.S. Pat. No. 4,299,938 and U.S. Pat. No. 4,339,567.

From the group of aliphatic epoxides there are suitable especially the monofunctional symbol α-olefin epoxides having an unbranched chain consisting of 10, 12, 14 or 16 carbon atoms.

Because nowadays a large number of different epoxy compounds are commercially available, the properties of the binder can vary widely. One possible variation, for example depending upon the intended use of the composition, is the use of mixtures of different epoxy compounds and the addition of flexibilisers and reactive diluents.

The epoxy resins can be diluted with a solvent to facilitate application, for example when application is effected by spraying, but the epoxy compound is preferably used in the solvent-less state. Resins that are viscous to solid at room temperature can be applied hot. Also suitable as crosslinkable components are all customary vinyl ethers, such as aromatic, aliphatic or cycloaliphatic vinyl ethers and also silicon-containing vinyl ethers. These are compounds having at least one, preferably at least two, vinyl ether groups in the molecule. Examples of vinyl ethers suitable for use in the compositions according to the invention include triethylene glycol divinyl ether, 1,4-cyclohexanedimethanol divinyl ether, 4-hydroxybutyl vinyl ether, the propenyl ether of propylene carbonate, dodecyl vinyl ether, tert-butyl vinyl ether, tert-amyl vinyl ether, cyclohexyl vinyl ether, 2-ethylhexyl vinyl ether, ethylene glycol monovinyl ether, butanediol monovinyl ether, hexanediol monovinyl ether, 1,4-cyclohexanedimethanol monovinyl ether, diethylene glycol monovinyl ether, ethylene glycol divinyl ether, ethylene glycol butylvinyl ether, butane-1,4-diol divinyl ether, hexanediol divinyl ether, diethylene glycol divinyl ether, triethylene glycol divinyl ether, triethylene glycol methylvinyl ether, tetra-ethylene glycol divinyl ether, pluriol-E-200 divinyl ether, polytetrahydrofuran divinyl ether-290, trimethylolpropane trivinyl ether, dipropylene glycol divinyl ether, octadecyl vinyl ether, (4-cyclohexylmethyleneoxyethene)-glutaric acid methyl ester and (4-butoxyethene)-iso-phthalic acid ester.

Examples of hydroxy-containing compounds include polyester polyols, such as, for example, polycaprolactones or polyester adipate polyols, glycols and polyether polyols, castor oil, hydroxy-functional vinyl and acrylic resins, cellulose esters, such as cellulose acetate butyrate, and phenoxy resins.

Further cationically curable formulations can be found, for example, in EPI 19425.

As crosslinkable component, preference is given to cycloaliphatic epoxides, or epoxides based on bisphenol A.

Accordingly, the composition contains at least one compound selected from the group of cycloaliphatic epoxy compounds, glycidyl ethers, oxetane compounds, vinyl ethers, acid-crosslinkable melamine resins, acid-crosslinkable hydroxymethylene compounds and acid-crosslinkable alkoxy-methylene compounds.

If desired, the composition can also contain free-radically polymerisable components, such as ethylenically unsaturated monomers, oligomers or polymers.

It is also possible to use compounds that can be crosslinked equally both free-radically and cationically. Such compounds contain, for example, both a vinyl group and a cycloaliphatic epoxy group. Examples thereof are described in JP 2-289611-A and U.S. Pat. No. 6,048,953.

Mixtures of two or more such free-radically polymerisable materials can also be used.

Binders may also be added to the compositions, this being especially advantageous when the photopolymerisable compounds are liquid or viscous substances. The amount of binder may be, for example, from 5 to 95% by weight, preferably from 10 to 90% by weight and especially from 40 to 90% by weight, based on total solids. The unsaturated compounds may also be used in admixture with non-photopolymerisable film-forming components.

The alkyd resins used as crosslinkable component contain a large number of unsaturated, aliphatic compounds, at least some of which are polyunsaturated. The unsaturated aliphatic compounds preferably used for the preparation of those alkyd resins are unsaturated aliphatic monocarboxylic acids, especially polyunsaturated aliphatic monocarboxylic acids. Examples of mono-unsaturated fatty acids are myristoleic acid, palmitic acid, oleic acid, gadoleic acid, erucic acid and ricinoleic acid. Preferably fatty acids containing conjugated double bonds, such as dehydrogenated castor oil fatty acid and/or tung oil fatty acid, are used. Other suitable monocarboxylic acids include tetrahydrobenzoic acid and hydrogenated or non-hydrogenated abietic acid or the isomers thereof. If desired, the monocarboxylic acid in question may be used wholly or in part in the form of a triglyceride, e.g. as vegetable oil, in the preparation of the alkyd resin. If desired, mixtures of two or more such mono-carboxylic acids or triglycerides may be used, optionally in the presence of one or more saturated, (cyclo)aliphatic or aromatic monocarboxylic acids, e.g. pivalic acid, 2-ethylhexanoic acid, lauric acid, palmitic acid, stearic acid, 4-tert-butyl-benzoic acid, cyclopentanecarboxylic acid, naphthenic acid, cyclohexanecarboxylic acid, 2,4-dimethylbenzoic acid, 2-methylbenzoic acid and benzoic acid.

If desired, polycarboxylic acids may also be incorporated into the alkyd resin, such as phthalic acid, isophthalic acid, terephthalic acid, 5-tert-butylisophthalic acid, trimellitic acid, pyromellitic acid, succinic acid, adipic acid, 2,2,4-trimethyladipic acid, azelaic acid, sebacic acid, dimerised fatty acids, cyclopentane-1,2-dicarboxylic acid, cyclohexane-1,2-dicarboxylic acid, 4-methylcyclohexane-1,2-dicarboxylic acid, tetrahydrophthalic acid, endomethylene-cyclohexane-1,2-dicarboxylic acid, butane-1,2,3,4-tetracarboxylic acid, endoisopropylidene-cyclohexane-1,2-dicarboxylic acid, cyclohexane-1,2,4,5-tetracarboxylic acid and butane-1,2,3,4-tetracarboxylic acid. If desired, the carboxylic acid in question may be used as an anhydride or in the form of an ester, for example an ester of an alcohol having from 1 to 4 carbon atoms.

In addition, the alkyd resin can be composed of di- or poly-valent hydroxyl compounds. Examples of suitable divalent hydroxyl compounds are ethylene glycol, 1,3-propanediol, 1,6-hexanediol, 1,12-dodecanediol, 3-methyl-1,5-pentanediol, 2,2,4-trimethyl-1,6-hexanediol, 2,2-dimethyl-1,3-propanediol and 2-methyl-2-cyclohexyl-1,3-propanediol. Examples of suitable triols are glycerol, trimethylolethane and trimethylolpropane. Suitable polyols having more than 3 hydroxyl groups are pentaerythritol, sorbitol and etherified products of the compounds in question, such as ditrimethylolpropane and di-, tri- and tetra-pentaerythritol. Preferably, compounds having from 3 to 12 carbon atoms, e.g. glycerol, pentaerythritol and/or dipentaerythritol, are used.

The alkyd resins can be obtained by direct esterification of the constituents, with the option that some of those components may already have been converted into ester diols or polyester diols. The unsaturated fatty acids can also be used in the form of a drying oil, such as linseed oil, tuna fish oil, dehydrogenated castor oil, coconut oil and dehydrogenated coconut oil. The final alkyd resin is then obtained by transesterification with the other acids and diols added. The transesterification is advantageously carried out at a temperature in the range of from 115 to 250° C., optionally in the presence of solvents such as toluene and/or xylene. The reaction is advantageously carried out in the presence of a catalytic amount of a transesterification catalyst. Examples of suitable transesterification catalysts include acids, such as p-toluenesulphonic acid, basic compounds, such as an amine, or compounds such as calcium oxide, zinc oxide, tetraisopropyl orthotitanate, dibutyltin oxide and triphenylbenzylphosphonium chloride.

The vinyl ether, acetal and/or alkoxysilane compounds used as part of crosslinkable component preferably contain at least two vinyl ether, acetal and/or alkoxysilane groups and have a molecular weight of 150 or more. Those vinyl ether, acetal and/or alkoxysilane compounds can be obtained, for example, by the reaction of a commercially available vinyl ether, acetal and/or alkoxysilane compound containing a vinyl ether, acetal and/or alkoxysilane group and in addition a maximum of one functional amino, epoxy, thiol, isocyanate, acrylic, hydride or hydroxyl group, with a compound having at least two groups capable of reacting with an amino, epoxy, thiol, isocyanate, acrylic, hydride or hydroxyl group. As examples thereof there may be mentioned compounds having at least two epoxy, isocyanate, hydroxyl and/or ester groups or compounds having at least two ethylenically or ethynylenically unsaturated groups.

As polymerizable component, preference is given to a composition in which the vinyl ether, acetal and/or alkoxysilane compounds are covalently bonded to the alkyd resin by addition via a reactive group such as an amino, hydroxyl, thiol, hydride, epoxy and/or isocyanate group. For that purpose, the compounds must have at least one group capable of forming an adduct with the reactive groups present in the alkyd resin.

To incorporate vinyl ether groups into the alkyd resin, use is made of a vinyloxyalkyl compound, the alkyl group of which is substituted by a reactive group, such as a hydroxyl, amino, epoxy or isocyanate group, that is capable of forming an adduct with one or more of the reactive groups present in the alkyd resin.

As polymerizable component, preference is given to compositions in which the ratio of the number of oxidatively drying groups present in the alkyd resin to the number of groups that are reactive in the presence of an acid is in the range of from 1/10 to 15/1, especially from 1/3 to 5/1. Instead of a single modified alkyd resin, it is also possible to use a plurality of alkyd resins, with one alkyd resin being highly modified and the others being less modified or not modified at all.

Examples of vinyl ether compounds capable of being covalently bonded to the alkyd resin are ethylene glycol monovinyl ether, butanediol monovinyl ether, hexanediol monovinyl ether, triethylene glycol monovinyl ether, cyclohexanedimethanol monovinyl ether, 2-ethylhexanediol monovinyl ether, polytetrahydrofuran monovinyl ether, tetraethylene glycol monovinyl ether, trimethylolpropane divinyl ether and aminopropyl vinyl ether.

Adducts can be formed, for example, by reacting the vinyl ether compounds containing a hydroxyl group or amino group with an excess of a diisocyanate, followed by the reaction of that free-isocyanate-group-containing adduct with the free hydroxyl groups of the alkyd resin. Preferably, a process is used in which first the free hydroxyl groups of the alkyd resin react with an excess of a polyisocyanate, and then the free isocyanate groups react with an amino-group- or hydroxyl-group-containing vinyl ether compound. Instead of a diisocyanate, it is also possible to use a diester. Transesterification of the hydroxyl groups present in the alkyd resin with an excess of the diester, followed by transesterification or transamidation of the remaining ester groups with hydroxyfunctional vinyl ether compounds or amino-functional vinyl ether compounds, respectively, yields vinyl-ether-functional alkyd resins. It is also possible to incorporate (meth)acrylate groups into the alkyd resin during preparation of the alkyd resin, by carrying out the preparation in the presence of a hydroxyfunctional (meth)acrylate ester, such as hydroxyethyl methacrylate (HEMA), and then reacting the thus functionalised alkyd resin by means of a Michael reaction with a vinyl-ether-group-containing compound and a primary-amino-group-containing compound, followed by reaction with e.g. an isocyanate compound, in order to obtain a non-basic nitrogen atom. An example of such a reaction is described, for example, in WO99/47617. Esterification of ricinine fatty acid with dipentaerythritol, followed by transesterification of the free hydroxyl groups with diethyl malonate and 4-hydroxybutyl vinyl ether in a suitable ratio, yields a vinyl-ether-functional alkyd resin suitable for use as polymerizable component.

When free-radically polymerisable components are added to the formulation according to the invention, it may be advantageous to add also a suitable free-radical photoinitiator or a mixture of such photoinitiators A compound that increases the solubility of the cationically or acid-catalytically polymerisable or crosslinkable compound in a developer under the action of acid;

The photopolymerisable mixtures can comprise various additives in addition to the photoinitiator. Examples thereof include thermal inhibitors, light stabilisers, optical brighteners, fillers and pigments, as well as white and coloured pigments, dyes, antistatics, adhesion promoters, wetting agents, flow auxiliaries, lubricants, waxes, anti-adhesive agents, dispersants, emulsifiers, anti-oxidants; fillers, e.g. talcum, gypsum, silicic acid, rutile, carbon black, zinc oxide, iron oxides; reaction accelerators, thickeners, matting agents, antifoams, and other adjuvants customary, for example, in lacquer, ink and coating technology.

Acceleration of the photopolymerisation can also be effected by adding as further additives photosensitisers that shift or broaden the spectral sensitivity. These are especially aromatic carbonyl compounds, such as, for example, benzophenone, thioxanthone, and especially also isopropylthioxanthone, phenothiazine derivatives, anthraquinone and 3-acyl-coumarin derivatives, terphenyls, styryl ketones, and 3-(aroylmethylene)-thiazolines, camphorquinone, and also eosin, rhodamine and erythrosin dyes, and anthracene derivatives, such as, for example, 9-methylanthracene, 9,10-dimethylanthracene, 9,10-diethoxyanthracene, 9,10-dibutyloxyanthracene, 9-methoxyanthracene, 9-anthracenemethanol, especially 9,10-dimethoxy-2-ethyl-anthracene, 9,10-dibutyloxyanthracene and 9,10-diethoxyanthracene. Further suitable photosensitisers are mentioned, for example, in WO 98/47046.

Further examples of suitable photosensitisers are disclosed in WO 06/008251, page 36, line 30 to page 38, line 8, the disclosure of which is hereby incorporated by reference. The sensitisers described above are customary in the art and are accordingly used in amounts customary in the art, preferably in a concentration of from 0.05 to 5%, especially in a concentration of from 0.1 to 2%, based on the composition.

The compositions according to the invention may additionally comprise further photoinitiators (e), such as, for example, cationic photoinitiators, photo acid-formers and free-radical photoinitiators as co-initiators in amounts of from 0.01 to 15%, preferably from 0.1 to 5%.

It is also possible to use electron donor compounds, such as, for example, alkyl- and arylamine donor compounds, in the composition. Such compounds are, for example, 4-dimethylaminobenzoic acid, ethyl 4-dimethylaminobenzoate, 3-dimethylaminobenzoic acid, 4-dimethylaminobenzoin, 4-dimethylaminobenzaldehyde, 4-dimethylaminobenzonitrile and 1,2,4-trimethoxybenzene. Such donor compounds are preferably used in a concentration of from 0.01 to 5%, especially in a concentration of from 0.05 to 0.50%, based on the formulation.

Examples of cationic photoinitiators and acid-formers are phosphonium salts, diazonium salts, pyridinium salts, iodonium salts, such as for example tolylcumyliodonium tetrakis (pentafluorophenyl)borate, 4-[(2-hydroxy-tetradecyloxy) phenyl]phenyliodonium hexafluoroantimonate or hexafluorophosphate (SarCat® CD 1012; Sartomer), tolylcumyliodonium hexafluorophosphate, 4-isobutylphenyl-4'-methylphenyliodonium hexafluorophosphate (IRGACURE®250, Ciba Specialty Chemicals), 4-octyloxyphenyl-phenyliodonium hexafluorophosphate or hexafluoroantimonate, bis(dodecylphenyl)iodonium hexafluoroantimonate or hexafluorophosphate, bis(4-methylphenyl)iodonium hexafluorophosphate, bis(4-methoxyphenyl)iodonium hexafluorophosphate, 4-methylphenyl-4'-ethoxyphenyliodonium hexafluorophosphate, 4-methylphenyl-4'-dodecylphenyliodonium hexafluorophosphate, 4-methylphenyl-4'-phenoxyphenyliodonium hexafluorophosphate. Of all the iodonium salts mentioned, compounds with other anions are, of course, also suitable; further sulphonium salts, obtainable, for example, under the trade names CYRACURE® UVI-6990, CYRACURE® UVI-6974 (Union Carbide), DEGACURE® KI 85 (Degussa), SP-55, SP-150, SP-170 (Asahi Denka), GE UVE 1014 (General Electric), SarCat® KI-85 (=triarylsulphonium hexafluorophosphate; Sartomer), SarCat® CD 1010 (=mixed triarylsulphonium hexafluoroantimonate; Sartomer); SarCat® CD 1011 (=mixed triarylsulphonium hexafluorophosphate; Sartomer); ferrocenium salts, e.g. ($^6$-isopropylbenzene)($^5$-cyclopentadienyl)-iron-II hexafluorophosphate, nitrobenzylsulphonates, alkyl- and aryl-N-sulphonyloxyimides and further known alkylsulphonic acid esters, haloalkylsulphonic acid esters, 1,2-disulphones, oxime sulphonates, benzoin tosylate, tolylsulphonyloxy-2-hydroxy-2-methyl-1-phenyl-1-propanone and further known betaketosulphones, beta-sulphonylsulphones, bis(alkylsulphonyl)diazomethane, bis(4-tert-butylphenyl-sulphonyl)-diazomethane, benzoyl-tosyl-diazomethane, iminosulphonates and imidosulphonates and trichloromethyl-s-triazines and other haloalkyl-group-containing compounds. Examples of further suitable additional photolatent acids (b1) include the examples of cationic photoinitiators and acid-formers as given in WO04/074242, page 38, line 10 to page 41, line 14, as well as the compounds disclosed in the examples of WO04/074242, the relevant disclosure of which is incorporated herein by reference. Exposure to radiation can be followed by a thermal post-curing step.

Previous compositions are efficiently cured by electron beam or when irradiated with electromagnetic waves in the presence of photo-acid generators and in particular cationic photoinitiators such as ionium salts, in particular sulfonium and iodonium salts.

Also suitable for fast curing and conversion to a solid state are compositions comprising one or several monomers and oligomers sensitive to polycondensation catalysed by photolatent bases. Photolatent bases are in particular photolatent tertiary amines or amidines. Examples of photolatent bases comprise compounds of the formula I, $$Z-A \qquad (I), \text{wherein}$$

Z is a photolabile group; and

A is an amidine or amine base precursor group, covalently bonded to Z.

Examples of compounds Z-A are compounds of formula

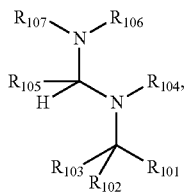
(I)

in which
R$_{101}$ is phenyl, biphenyl, naphthyl, anthryl or anthraquinonyl which is unsubstituted or substituted by one or more of the substituents C$_1$-C$_4$-alkyl, C$_2$-C$_4$-alkenyl, CN, OR$_{110}$, SR$_{110}$, COOR$_{112}$, halogen or a substituent of structure (II)

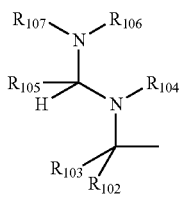
(II)

or
R$_{101}$ is a substituent of formula (III)

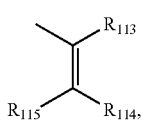
(III)

in which
R$_{113}$ is phenyl, biphenyl, naphthyl, anthryl or anthraquinonyl which is unsubstituted or substituted by one or more of the substituents C$_1$-C$_4$-alkyl, C$_2$-C$_4$-alkenyl, CN, OR$_{110}$, SR$_{110}$, COR$_{111}$, COOR$_{112}$, or halogen;

R$_{114}$ is hydrogen

R$_{115}$ is hydrogen or C$_1$-C$_4$-alkyl;

R$_{102}$ and R$_{103}$ independently of each other are hydrogen or C$_1$-C$_6$-alkyl;

R$_{104}$ and R$_{106}$ together form a C$_2$-C$_6$-alkylene bridge that is unsubstituted or substituted by one or more C$_1$-C$_4$-alkyl groups; or R$_{105}$ and R$_{107}$, together form a C$_2$-C$_6$-alkylene bridge that is unsubstituted or substituted by one or more C$_1$-C$_4$-alkyl groups;

R$_{110}$, R$_{111}$ and R$_{112}$ independently of each other are hydrogen or C$_1$-C$_6$-alkyl; or compounds of formula

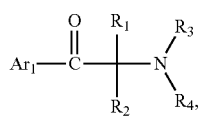

in which
Ar$_1$ is an aromatic radical of formula V or VIII

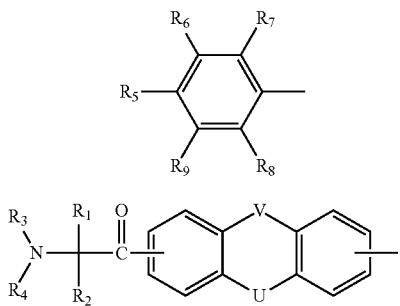
(V)

(VIII)

U is N(R$_{17}$)—;
V has the meaning of U or is a direct bond;
R$_1$ and R$_2$ are each independently of each other
  a) C$_1$-C$_{12}$-alkyl, which is unsubstituted or substituted by OH, C$_1$-C$_4$-alkoxy, or SH,
  b) a radical of formula $$—(CHR_{13})—\overset{R_{14}}{\underset{|}{C}}=\overset{R_{15}}{\underset{|}{C}}—R_{16}$$

or
  c) a radical of formula

—⟨(CH$_2$)$_q$⟩ in which q is 0, or 1, or
  d) a radical of formula $$—\overset{R_{13}}{\underset{|}{CH}}—Ar_2;$$

e) phenyl which is unsubstituted or substituted C$_1$-C$_4$-alkyl;
or R1 and R2 together are unbranched or branched C$_4$-C$_6$-alkylene or C$_3$-C$_5$-oxaalkylene,
Ar$_2$ is a phenyl radical which is unsubstituted or substituted by halogen, OH, C$_1$-C$_{12}$-alkyl, or is substituted by C$_1$-C$_4$-alkyl, which is substituted by OH, halogen, C$_1$-C$_{12}$-alkoxy, —COO(C$_1$-C$_4$-alkyl), —CO(OCH$_2$CH$_2$)$_n$OCH$_3$ or —OCO(C$_1$-C$_4$-alkyl), or the radical phenyl, is substituted by C$_1$-C$_4$-alkoxy, —(OCH$_2$CH$_2$)$_n$OH, or —(OCH$_2$CH$_2$)$_n$OCH$_3$, with n is 1-5

R$_3$ is C$_1$-C$_4$-alkyl, C$_2$-C$_4$-alkyl which is substituted by —OH, —C$_1$-C$_4$-alkoxy, —CN, or —COO(C$_1$-C$_4$-alkyl), or R$_3$ is C$_3$-C$_5$-alkenyl, or phenyl-C$_1$-C$_3$-alkyl-;

R$_4$ is C$_1$-C$_4$-alkyl, C$_2$-C$_4$-alkyl which is substituted by —OH, —C$_1$-C$_4$-alkoxy, —CN, or —COO(C$_1$-C$_4$-alkyl), or R$_3$ is C$_3$-C$_5$-alkenyl, or phenyl-C$_1$-C$_3$-alkyl-, or R$_3$ and R$_4$ together are C$_3$-C$_7$-alkylene which can be interrupted by —O—, or —S—;

R$_5$, R$_6$, R$_7$, R$_8$ and R$_9$ are each independently of one another hydrogen, halogen, C$_1$-C$_{12}$alkyl, phenyl, benzyl, benzoyl, or a group —OR$_{17}$, —SR$_{18}$, —N(R$_{19}$)(R$_{20}$), or

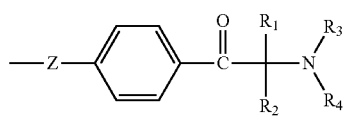

Z is —O—, —S—, —N($R_{11}$)—$R_{12}$—N($R_{11}$)— or

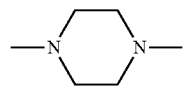

$R_{11}$ is $C_1$-$C_4$-alkyl,
$R_{12}$ is unbranched or branched $C_2$-$C_{16}$-alkylene which can be interrupted by one or more —O— or —S—
$R_{13}$ is hydrogen or $C_1$-$C_4$-alkyl;
$R_{14}$, $R_{15}$ and $R_{16}$ are each independently of one another hydrogen or $C_1$-$C_4$-alkyl, or R14 and
$R_{15}$ together are $C_3$-$C_4$-alkylene;
$R_{17}$ is hydrogen, $C_1$-$C_{12}$-alkyl, $C_3$-$C_6$-alkenyl, $C_2$-$C_6$-alkyl which is substituted by —CN, —OH or —COO($C_1$-$C_4$-alkyl);
$R_{18}$ is hydrogen, $C_1$-$C_{12}$-alkyl, $C_3$-$C_6$-alkenyl, $C_2$-$C_{12}$-alkyl which is substituted by —OH, —CN, —COO($C_1$-$C_4$-alkyl),
$R_{19}$ g and $R_{20}$ are each independently of the other $C_1$-$C_6$-alkyl, $C_2$-$C_4$-hydroxyalkyl, $C_2$-$C_{10}$alkoxyalkyl, $C_3$-$C_5$-alkenyl, phenyl-$C_1$-$C_3$-alkyl, phenyl which is unsubstituted or substituted by $C_1$-$C_4$-alkyl or $C_1$-$C_4$-alkoxy, or $R_{19}$ and $R_{20}$ are $C_2$-$C_3$-alkanoyl or benzoyl, or $R_{19}$ and $R_{20}$ are —O(CO—$C_1$-$C_8$)$_o$—OH with o is 1-15
or $R_{19}$ and $R_{20}$ together are $C_4$-$C_6$-alkylene which can be interrupted by —O—, —N($R_{22}$)— or —S—,
or $R_{19}$ and $R_{20}$ together are $C_4$-$C_6$-alkylene which can be substituted by hydroxyl, $C_1$-$C_4$alkoxy or —COO($C_1$-$C_4$-alkyl);
$R_{22}$ is —$C_1$-$C_4$-alkyl, phenyl-$C_1$-$C_3$-alkyl, —$CH_2CH_2$—COO($C_1$-$C_4$-alkyl), —$CH_2CH_2$CN, —$CH_2CH_2$—COO($CH_2CH_2$O)$_q$—H or

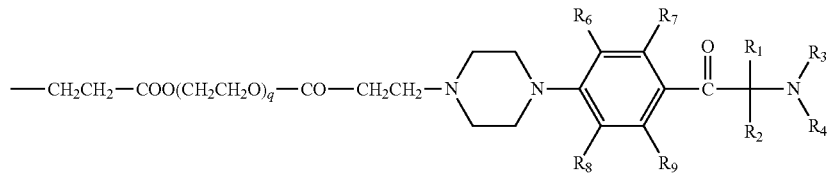

and q is 1-8.

In addition to the photolatent catalyst, the photopolymerisable mixtures can comprise various additives. Examples thereof include thermal inhibitors, light stabilisers, optical brighteners, fillers and pigments, as well as white and coloured pigments, dyes, antistatics, adhesion promoters, wetting agents, flow auxiliaries, lubricants, waxes, anti-adhesive agents, dispersants, emulsifiers, anti-oxidants; fillers, e.g. talcum, gypsum, silicic acid, rutile, carbon black, zinc oxide, iron oxides; reaction accelerators, thickeners, matting agents, antifoams, and other adjuvants customary, for example, in lacquer, ink and coating technology. Photopolymerization can also be accelerated by adding further photosensitizers or coinitiators (as additive) which shift or broaden the spectral sensitivity. These are, in particular, aromatic compounds, for example benzophenone and derivatives thereof, thioxanthone and derivatives thereof, anthraquinone and derivatives thereof, coumarin and phenothiazine and derivatives thereof, and also 3-(aroylmethylene)thiazolines, rhodanine, camphorquinone, but also eosine, rhodamine, erythrosine, xanthene, thioxanthene, acridine, e.g. 9-phenylacridine, 1,7-bis(9-acridinyl)heptane, 1,5-bis(9-acridinyl)pentane, cyanine and merocyanine dyes.

Particularly preferred oligomeric/polymeric systems are binders which are customary in the industry and known to the person skilled in the art.

Examples of base-catalysable binders of this kind are:
a) acrylic copolymers with alkoxysilane and/or alkoxysiloxane side groups, examples being the polymers described in U.S. Pat. No. 4,772,672, U.S. Pat. No. 4,444,974 or EP1092757;
b) two-component systems comprising hydroxyl-containing polyacrylates, polyesters and/or polyethers and aliphatic or aromatic polyisocyanates;
c) two-component systems comprising functional polyacrylates and a mono- or multi-functionalized epoxide component, the polyacrylate containing thiol, amino, carboxyl and/or anhydride groups, as described, for example, in EP 898202;
d) two-component systems comprising fluorine-modified or silicone-modified, hydroxyl-containing polyacrylates, polyesters and/or polyethers and aliphatic or aromatic polyisocyanates;
e) two-component systems comprising (poly)ketimines and aliphatic or aromatic polyisocyanates;
f) two-component systems comprising (poly)ketimines and unsaturated acrylic resins or acetoacetate resins or methyl α-acrylamidomethylglycolate;
g) two-component systems comprising (poly)oxazolidines and polyacrylates containing anhydride groups or unsaturated acrylic resins or polyisocyanates;
h) two-component systems comprising epoxy-functional polyacrylates and carboxyl-containing or amino-containing polyacrylates;
i) polymers based on allyl glycidyl ether;
j) two-component systems comprising a (poly)alcohol and/or (poly)thiol and a (poly)isocyanate;
k) two-component systems comprising an α,β-ethylenically unsaturated carbonyl compound and a polymer containing activated $CH_2$ groups, the activated $CH_2$ groups being present either in the main chain or in the side chain or in both, as is described, for example, in EP 161697 for (poly)malonate groups. Other compounds containing activated $CH_2$ groups are (poly)acetoacetates and (poly)cyanoacetates.
l) Two-component systems comprising a polymer containing activated $CH_2$ groups, the activated $CH_2$ groups being present either in the main chain or in the side chain or in both, or a polymer containing activated $CH_2$ groups such as (poly)acetoacetates and (poly)cyanoacetates, and a polyaldehyde crosslinker, such as terephthalaldehyde. Such systems are described, for example, in Urankar et al., Polym. Prepr. (1994), 35, 933.

n) Two-component or one-component systems comprising blocked isocyanates and a hydrogen donor. Such systems are described for example in PCT/EP2007/056917, the disclosure of which hereby is incorporated by reference.
o) Thiol Michael systems. Examples are described by F. Cellesi et al. in Biomaterials (2004), 25(21), 5115.

Within this group of base-catalysable binders, the following are particularly preferred:
b) two-component systems comprising hydroxyl-containing polyacrylates, polyesters and/or polyethers and aliphatic or aromatic polyisocyanates;
c) two-component systems comprising functional polyacrylates and a mono- or multi-functionalized epoxide component, the polyacrylate containing thiol, amino, carboxyl and/or anhydride groups, as described, for example, in EP 898202;
m) two-component systems comprising a (poly)alcohol and/or (poly)thiol and a (poly)isocyanate;
n) two-component systems comprising an α,β-ethylenically unsaturated carbonyl compound and a polymer containing activated $CH_2$ groups, the activated $CH_2$ groups being present either in the main chain or in the side chain or in both. Exposure to radiation can be followed by a thermal post-curing step.

Also suitable for fast curing and conversion to a solid state are compositions consisting in combinations of the previously described chemistries, often named as hybrid curing system. Additives other than catalysts, fillers, resins, prepolymers may also be added to improve curing, cured film/layer properties, and separation from the imaging shim. The lacquer or coating to be polymerized will have a viscosity and more generally rheology adapted to the coating or printing process used that enable an efficient and if possible consistent transfer of a wet film thickness just superior to the depth of the sub-microscopic, holographic diffraction grating image or pattern (OVI). Generally, the wet coating layer will be comprised between 0.1 and 100 μm and preferably 1 to 25 μm.

A preferred UV curable varnish (ultraviolet activated primer) comprises [(1-methyl-1,2-ethanediyl)bis[oxy(methyl-2,1-ethanediyl)]diacrylate (1-20%), poly(oxy-1,2-ethanediyl), α-hydroxy-[(1-oxo-2-propen-1-yl)oxy]-, ether with 2-ethyl-2-(hydroxymethyl)-1,3-propanediol (3:1) (10-50%), oligo[2-hydroxy-2-methyl-1-[4-(1-methylvinyl)phenyl]propanone] (1-5%), oxybis(methyl-2,1-ethanediyl)diacrylate (30-45%)]. Typically photoinitiators, such as, for example, 4-phenylbenzophenone and Esacure KIP 150, are present in an amount of 0.5-10%. The amount of all components sums up to 100% (by weight).

In a further embodiment of the present invention the ultraviolet coating can be coloured. That is the curable composition may comprise pigments and/or dyes.

The pigments can be transparent organic color pigments or inorganic pigments.

Suitable colored pigments especially include organic pigments selected from the group consisting of azo, azomethine, methine, anthraquinone, phthalocyanine, perinone, perylene, diketopyrrolopyrrole, thioindigo, dioxazine iminoisoindoline, dioxazine, iminoisoindolinone, quinacridone, flavanthrone, indanthrone, anthrapyrimidine and quinophthalone pigments, or a mixture or solid solution thereof; especially a dioxazine, diketopyrrolopyrrole, quinacridone, phthalocyanine, indanthrone or iminoisoindolinone pigment, or a mixture or solid solution thereof.

Colored organic pigments of particular interest include C.I. Pigment Red 202, C.I. Pigment Red 122, C.I. Pigment Red 179, C.I. Pigment Red 170, C.I. Pigment Red 144, C.I. Pigment Red 177, C.I. Pigment Red 254, C.I. Pigment Red 255, C.I. Pigment Red 264, C.I. Pigment Brown 23, C.I. Pigment Yellow 109, C.I. Pigment Yellow 110, C.I. Pigment Yellow 147, C.I. Pigment Orange 61, C.I. Pigment Orange 71, C.I. Pigment Orange 73, C.I. Pigment Orange 48, C.I. Pigment Orange 49, C.I. Pigment Blue 15, C.I. Pigment Blue 60, C.I. Pigment Violet 23, C.I. Pigment Violet 37, C.I. Pigment Violet 19, C.I. Pigment Green 7, C.I. Pigment Green 36, the 2,9-dichloro-quinacridone in platelet form described in WO08/055,807, or a mixture or solid solution thereof.

Plateletlike organic pigments, such as plateletlike quinacridones, phthalocyanine, fluororubine, dioxazines, red perylenes or diketopyrrolopyrroles can advantageously be used as component B.

Suitable colored pigments also include conventional inorganic pigments; especially those selected from the group consisting of metal oxides, antimony yellow, lead chromate, lead chromate sulfate, lead molybdate, ultramarine blue, cobalt blue, manganese blue, chrome oxide green, hydrated chrome oxide green, cobalt green and metal sulfides, such as cerium or cadmium sulfide, cadmium sulfoselenides, zinc ferrite, bismuth vanadate, Prussian blue, $Fe_3O_4$, carbon black and mixed metal oxides. Examples of commercially available inorganic pigments are BAYFERROX® 3920, BAYFERROX® 920, BAYFERROX® 645T, BAYFERROX® 303T, BAYFERROX® 110, BAYFERROX® 110 M, CHROMOXIDGRUEN GN, and CHROMOXIDGRUEN GN-M.

Examples of dyes, which can be used to color the curable composition, are selected from the group consisting of azo, azomethine, methine, anthraquinone, phthalocyanine, dioxazine, flavanthrone, indanthrone, anthrapyrimidine and metal complex dyes. Monoazo dyes, cobalt complex dyes, chrome complex dyes, anthraquinone dyes and copper phthalocyanine dyes are preferred.

The method of transferring the optically variable device into the fluoropolymer surface is by recombining the images by means of heat and pressure using a specifically prepared nickel plate which has the optically variable devices within its surface by means of nickel sulphamate electroforming. The nickel plate with the optically variable devices held within its surface is used to transfer the said image into the surface of the fluoropolymer, the fluoropolymer becomes the vehicle by which the sub microscopic image can be transferred into an ultraviolet coating printed onto the surface of a substrate and simultaneously cured.

The present invention ensures the optically variable images are transferred efficiently, with maximum fidelity of the optically variable devices and sub microscopic images, avoiding contamination associated with UV transfer systems, the surface of the fluoropolymer will not degrade, discolour or impair UV transmission through the fluoropolymer assuring consistent longevity in production.

The substrates being transparent filmic or non transparent substrates like opaque plastic, paper including but not limited to banknote, voucher, passport, and any other security or fiduciary documents, self adhesive stamp and excise seals, card, tobacco, pharmaceutical, computer software packaging and certificates of authentication, aluminium, and the like.

In a further embodiment the present invention is directed to a process for producing the embossing foil, especially belt, or sheet of the optically transparent fluoropolymer carrying the optically variable image to be applied, which comprises thermally embossing the original hologram into an optically transparent fluoropolymer.

Alternatively, a UV-curable formulation is applied onto the original shim while being simultaneously exposed to UV-light to generate a duplicated shim. The duplicated shim can be further used to print OVD as described in WO05/051675 and WO08/061,930. UV-light can be replaced by electron beams. In said embodiment a hologram master is used as a mold for casting further replicas in radiation-curable resin. The resin is coated onto the relief surface of the master and irradiated with the type of radiation that cures it (ultraviolet or electron beam); then the cured resin is separated from the master as a sheet. The relief surface is replicated thereby in the cured resin.

The original hologram can be embossed into an optically transparent fluoropolymer by using a durable master in the form of a nickel electroform as an embossing die for the optically transparent fluoropolymer.

The process includes the steps of (a) placing a hard metal embossing shim carrying the optically variable image directly onto the surface of the fluoropolymer sheet, (b) applying sufficient heat and pressure for a sufficient time to emboss the optically variable image onto the fluoropolymer sheet and (c) separating the shim from the sheet.

Said process will now be described, by way of example only, with reference to the accompanying examples and figures, in which.

In the following detailed description and in the several figures of the drawings like elements are identified with the like reference numerals.

Figure 1:
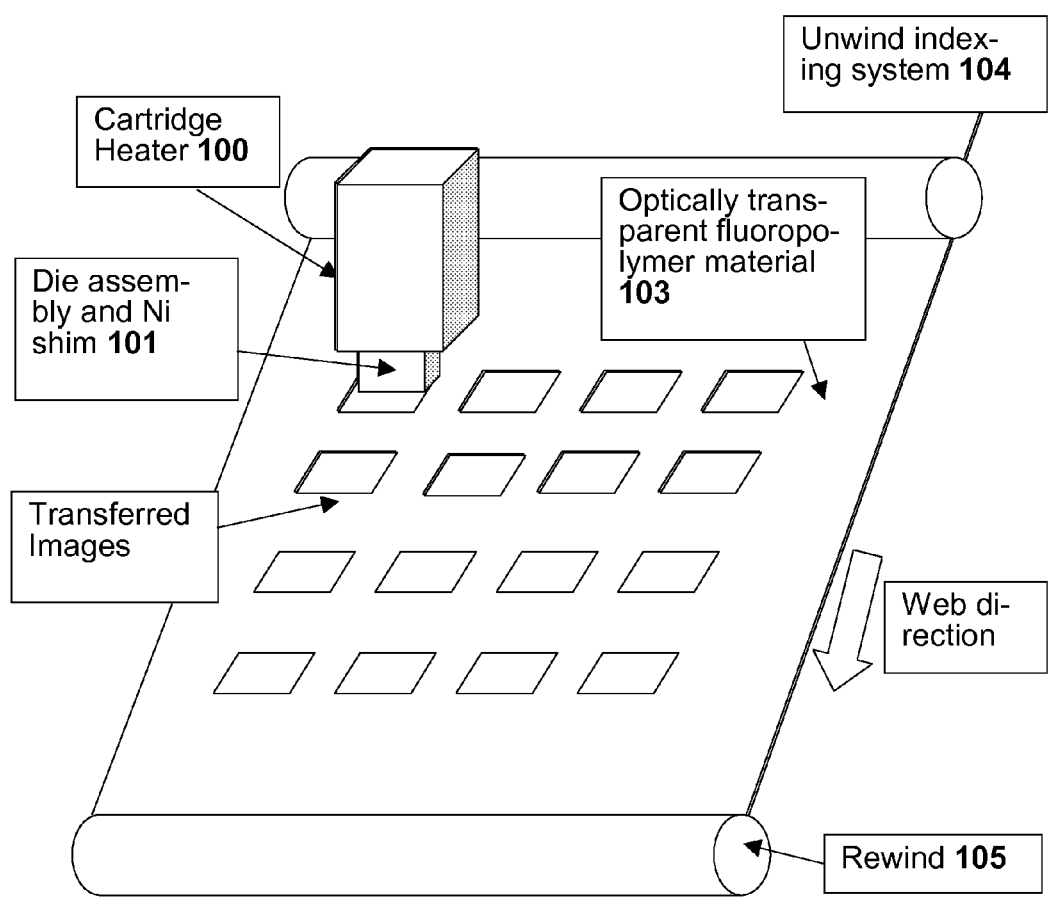
FIG. 1 is a schematic representation of a roll to roll mechanical recombination shim fabrication system.

In FIGS. 1 to 4 methods and apparatus for making and methods for forming a transfer shim in a transparent medium constructed in an optically transparent fluoropolymer holding optically variable (sub microscopic) images of all types are shown.

As shown in the drawings for purpose of illustration, the present invention is embodied in a shim fabrication system.

In one embodiment of the present invention the shim fabrication system includes a clear substrate in roll form which is compliant, an unwind (with accurate indexing system) and rewind unit for transporting the substrate, a heated cartridge and die assembly to which is attached a single image nickel shim master.

In an alternative embodiment of the present invention the shim fabrication system includes a clear substrate in sheet form which is compliant, an unwind (with accurate indexing system) and re-wind unit for transporting the substrate, a heated cartridge and die assembly to which is attached a single image nickel shim master.

In further alternative embodiments of the present invention the shim fabrication system includes a clear substrate in the form of a continuous belt which is compliant, an unwind (with accurate indexing system) and re-wind unit for transporting the substrate, a heated cartridge and die assembly to which is attached a single image nickel shim master.

In further alternative embodiment of the present invention the shim fabrication system includes a clear substrate in roll form which is compliant, an unwind (with accurate indexing system) and re-wind unit for transporting the substrate, a heated roller and nip roller to which is attached a nickel shim master with multiple images.

Once the fabricated shim is complete it is used to transfer the optically variable (sub microscopic) images of all types to a product substrate material (cf. WO2009/062867).

Referring to FIG. 1 an optically transparent fluoropolymer material 103 is unwound from a reel via an indexing roller 104, as it passes under a heated cartridge 100 the web stops and a die assembly 101 to which is attached a single image nickel shim master is brought into contact with the transparent fluoropolymer material 103 and under heat and pressure the image from the shim is embossed into the surface. This process is repeated as required on the web and the finished substrate is rewound on to a rewind unit 105.

Figure 2:
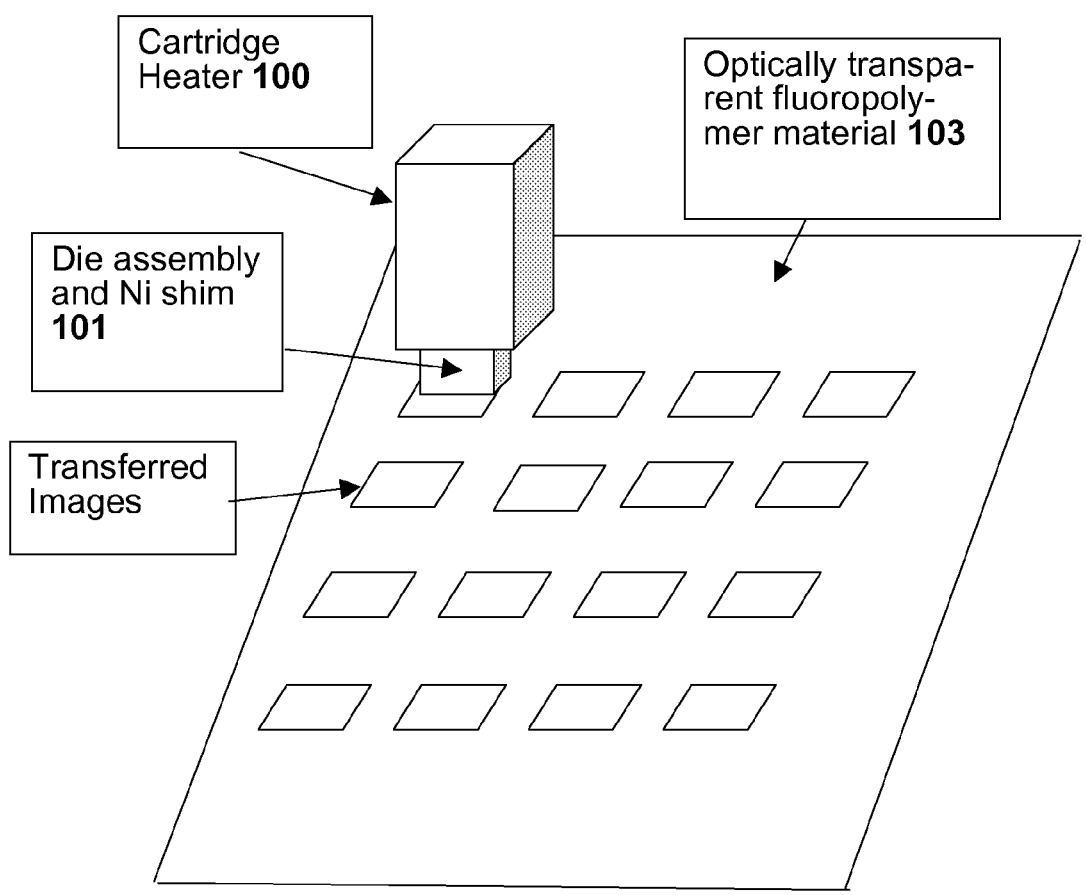
FIG. 2 shows a flat plate mechanical recombination shim construction system.

Referring to FIG. 2 an optically transparent fluoropolymer material 103 is placed under a heated cartridge 100 and a die assembly 101 to which is attached a single image nickel shim master is brought into contact with the transparent fluoropolymer material 103 and under heat and pressure the image from the shim is embossed into the surface. This process is repeated as required on the sheet.

Figure 3:
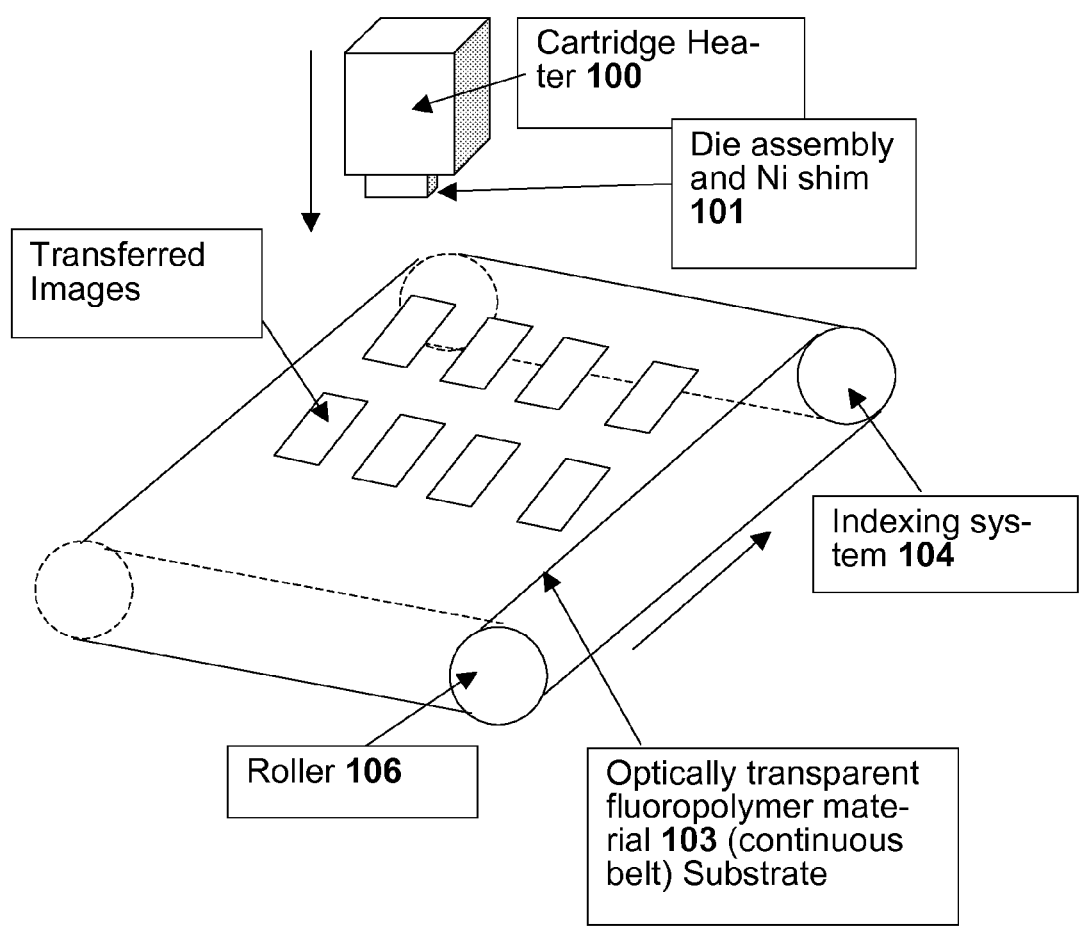
FIG. 3 is a schematic representation of a continuous belt mechanical recombination shim construction system.

Referring to FIG. 3 an optically transparent fluoropolymer material 103 in the form of a continuous belt is moved around a roller 106 via an indexing roller 104, as it passes under a heated cartridge 100 the belt stops and a die assembly 101 to which is attached a single image nickel shim master is brought into contact with the transparent fluoropolymer material 103 and under heat and pressure the image from the shim is embossed into the surface. This process is repeated as required on the belt.

Figure 4:
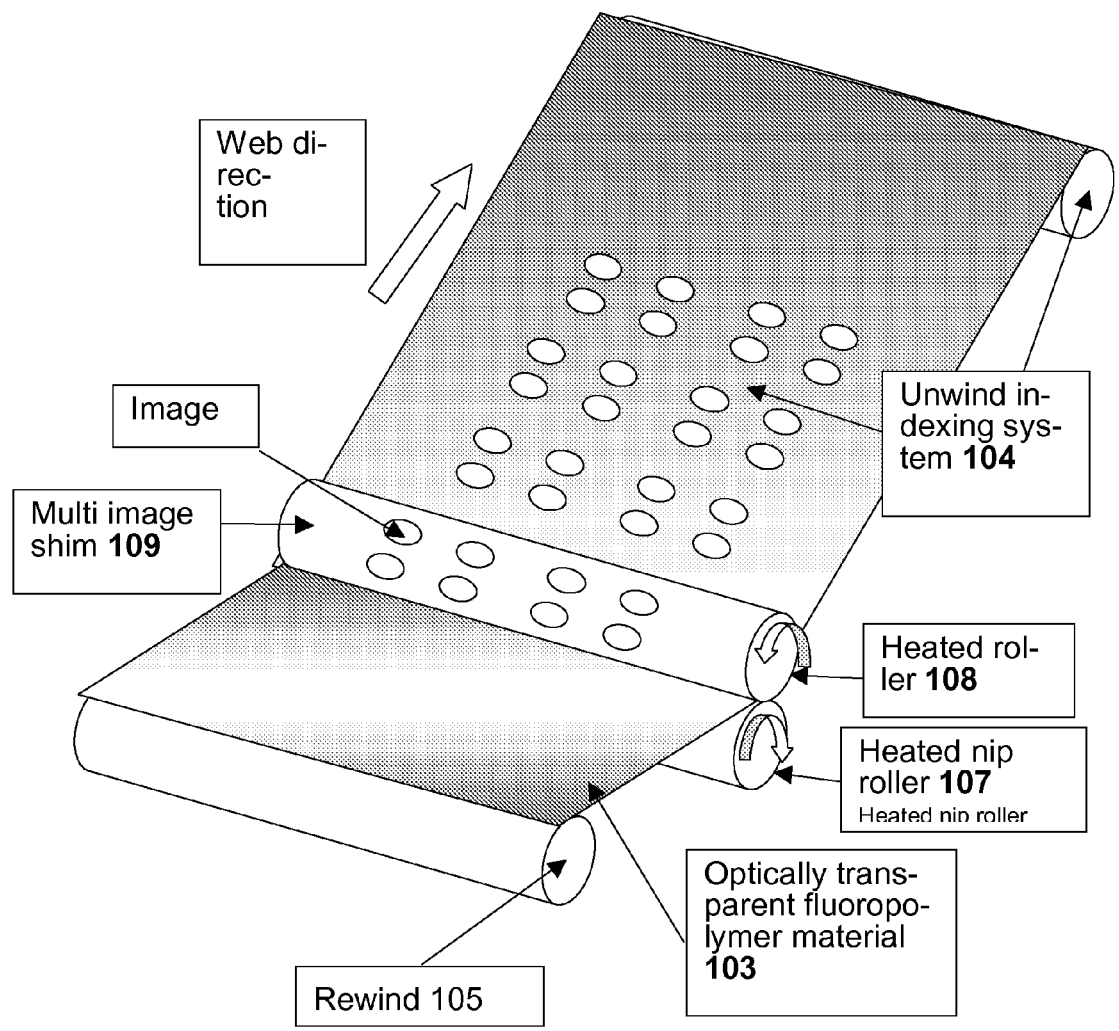
FIG. 4 is a schematic representation of a continuous hard embossing shim construction system.

Referring to FIG. 4 an optically transparent fluoropolymer material 103 is unwound from a reel via an indexing roller 104, it passes between a heated roller 108 which has a multi image shim attached 109 and nip roller 107 as the web of transparent fluoropolymer material 103 is brought into contact with the heat and pressure from heated roller 108 and nip roller 107 the image from the shim is embossed into it's surface. This is a continuous process and is repeated as required until the finished substrate is rewound on to a rewind unit 105.

Figure 5:
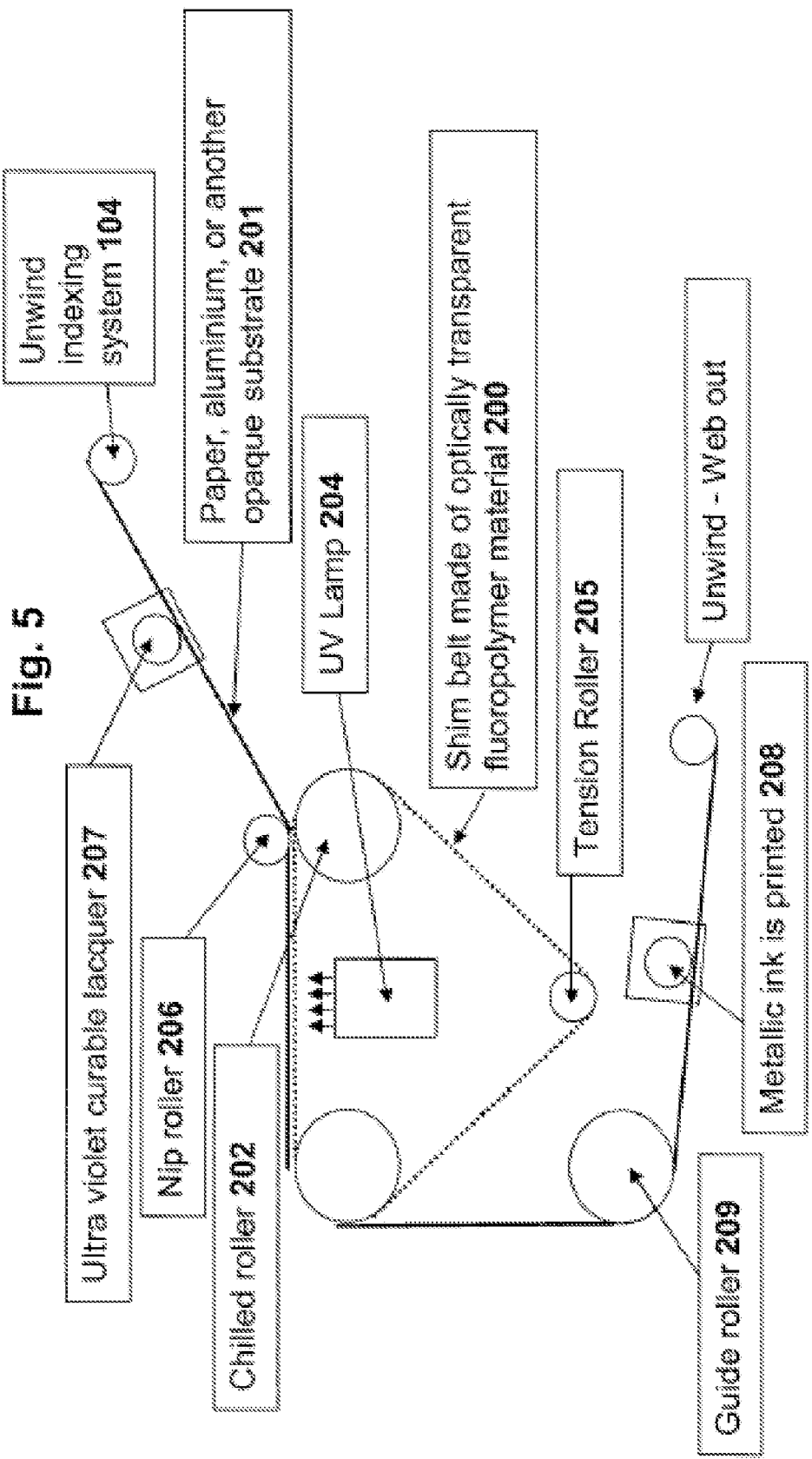
FIG. 5 shows an application apparatus for transferring images from the fluoropolymer shim to a substrate.

Referring to FIG. 5 a web of paper, aluminium, or another opaque substrate 201 is unwound from a reel via an indexing roller 104 and is printed with an ultra violet curable lacquer 207 on its lower surface. This web passes between nip roller 206 and chilled roller 202. A shim belt made of optically transparent fluoropolymer material 200 and containing an OVI which is imparted into the lacquer and instantly cured via an UV lamp 204 disposed through the shim belt 200. The OVI transferred to the substrate 201 is a facsimile of the image on the shim belt 200. The shim belt 200 is continuously running around chilled roller 202 and tension roller 205. The web passes round guide roller 209 and metallic ink is printed 208 over the OVI and causes the optically variable device or other lens or engraved structure to become light reflective.

Figure 6:
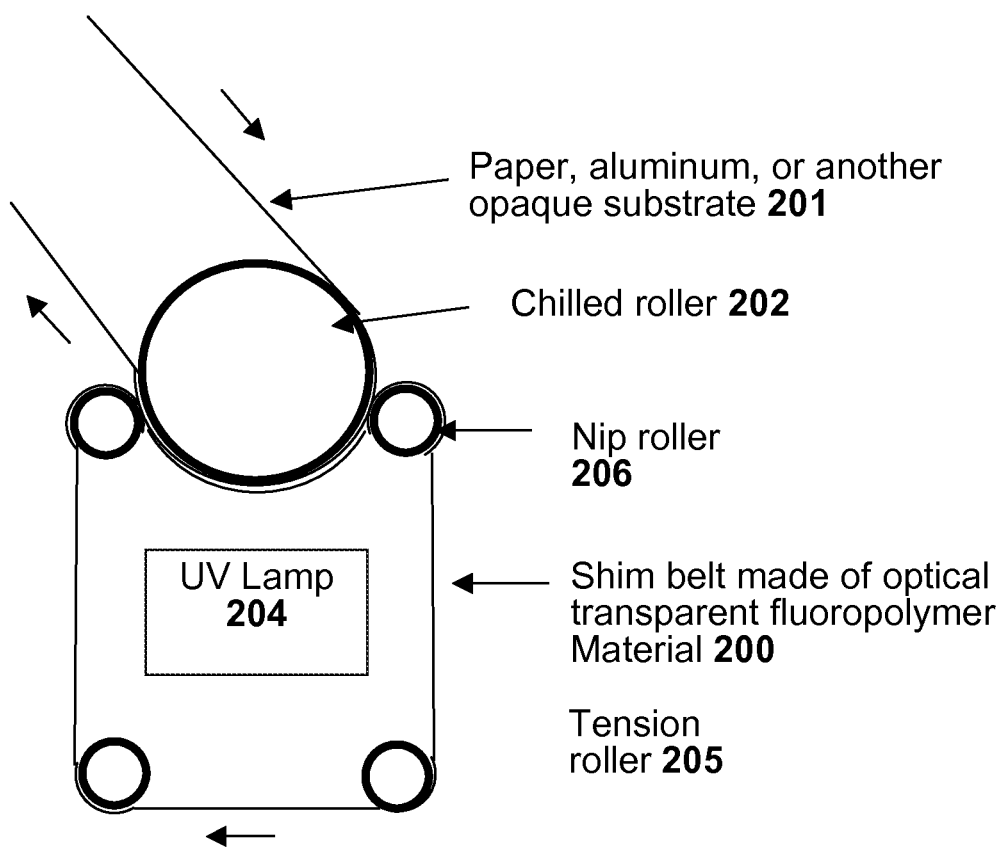
FIG. 6 shows an alternative transfer unit, which can be used in the application apparatus of FIG. 5.

Referring to FIG. 6 a web of paper, aluminium, or another opaque substrate 201 which has been printed with an ultra violet curable lacquer 207 on its surface passes between nip roller 206 and chilled roller 202. A shim belt made of optically transparent fluoropolymer material 200 and containing an OVI which is imparted into the lacquer and instantly cured via an UV lamp 204 disposed through the shim belt 200. The OVI transferred to the substrate 201 is a facsimile of the image on the shim belt 200. The shim belt 200 is continuously running around nip roller(s) 206 and tension roller(s) 205.

The optically variable image forming means of the present invention can also be used for the production of a hot stamping foil.

Accordingly, the present invention is also directed to a method of producing a hot stamping foil comprising the steps of:

(a) coating a carrier with a release coating,
(b) applying a coating of a hard lacquer onto the release coating,
(c) applying an ultraviolet primer coating onto the coating of the hard lacquer,
(d) contacting at least a portion of the ultraviolet primer coating with optically variable image (optically variable device) forming means;
(e) optionally depositing a layer of a transparent high reflective index material and/or a metallic layer to the UV primer holding the transferred optically variable device either as a whole or in partial areas,
(f) optionally printing subsequently process colours, and
(g) applying a heat activated adhesive onto the layer obtained in step d), e), or f), or the process colour layer; wherein the optically variable image forming means comprise an optically transparent embossing foil, especially belt, or sheet of an optically transparent fluoropolymer carrying the optically variable image to be applied and means to dry or cure the curable compound.

The optically variable image forming means comprise preferably an optically transparent embossing belt, or sheet of an optically transparent fluoropolymer carrying the optically variable image to be applied. In case of the embossing belt the means to dry or cure the curable compound are preferably arranged within the transparent belt.

Examples of the release compound are silica, microcrystalline wax, rice wax, oricuri wax, stearic acid esters, polyglycols, and metallic salts of fatty acids.

Examples of the coating of the hard lacquer are polymethylmethacrylate, styrene acrylonitrite, polyethyleneterephthalate, nitrocellulose, or mixtures thereof. The coating of the hard lacquer affixed to said release coating has in general a thickness in the range 0.25 microns to 9 microns and has a glass transition temperature of at least 70° C.

Examples of the adhesive compound are vinyl alcohol, polyacrylates, polyalkacrylates, vinyl resins, polyvinyl acetate, cellulose resins, polyacrylamides, and ethylene/vinyl acetate copolymers.

Under the present invention a carrier film substrate having the thickness on the order of 12 microns to 75 microns and formed of a suitable plastic material such as a polyester, oriented polypropylene or other suitable material is coated with a release coating such as a microcrystalline wax or a partially saponified montan wax or other wax based coatings having a thickness in the range of 0.025 microns to 5 microns and then has a coating of hard lacquer applied over the release coating in a thickness in the range of 0.25 microns to 10 microns. The hard lacquer coating may be applied by a gravure roller following which is dried an ultraviolet primer coating having the thickness in a range of 0.3 microns to 9 microns is then applied by means of a gravure roller. An optically variable device is contacted by the embossing shim having an optically variable device thereon and is transferred into the surface of the UV lacquer and cured by UV light. A layer of metal such as a vacuum metallised aluminium ink is applied to the UV primer holding the transferred optically variable device either as a whole or in partial areas. Subsequent process colours can be gravure printed.

Figure 7:
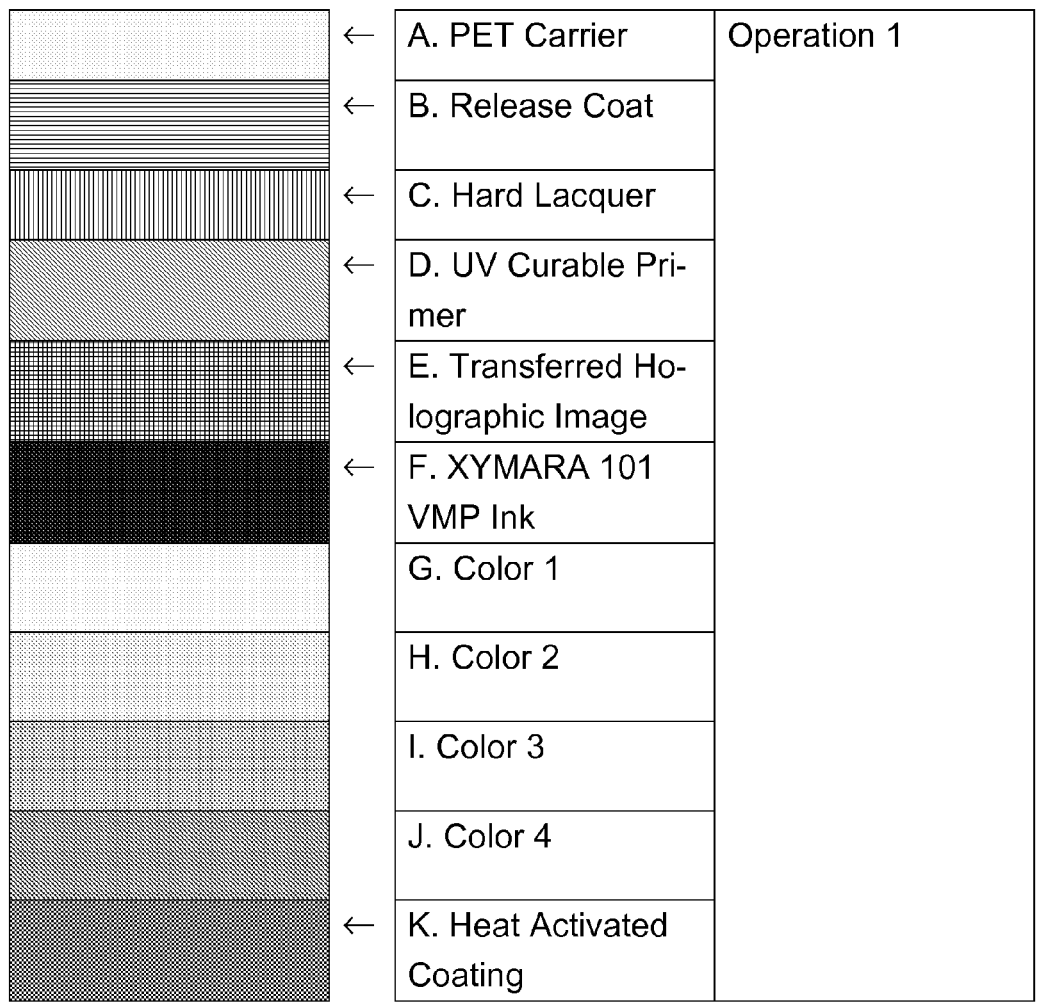
FIG. 7 is a sectional view of a holographic stamping foil of the present invention showing the various layers of the structure suitable for having an optically variable device transferred thereon.

FIG. 7 is a sectional view of a holographic stamping foil of the present invention showing the various layers of the structure suitable for having an optically variable device transferred thereon.

Referring now to FIG. 7 there is shown a composite sheet constructed according to the present invention which incorporates an OVD along with process colours. The composite sheet comprises 11 layers including a carrier A. The carrier A has a thickness in the range of 12 microns to 75 microns and maybe formed of one of a number of different types of material including a film of polyester such as polyethyleneterephthalate or film of biaxially oriented polypropylene, cellulose tri-acetate, polystyrene, polyethylene or polyvinylchloride. In one example, the substrate is a polyester film having a thickness of 12 microns obtained from ICI films, Wilmington, Del. (Product I.D Melinex HS-2). A release coating B of a wax such as a microcrystalline wax or montan wax or a siloxane having a thickness in the range of 0.025 microns to 10 microns is applied to the film substrate A.

A coating C of a hard lacquer such as polymethylmethacrylate, styrene acrylonitrile, polyethyleneterephthalate or nitrocellulose is applied to release coat in a thickness in the range of 0.25 microns to 9 microns.

A ultraviolet curable composition having a thickness of between 0.03 microns and 9 microns is applied to coating C.

An OVD is transferred into the surface of the UV primer using the embossing shim of the present invention and cured with ultraviolet light.

A layer of metal F having a thickness in the range of 0.03 to 9 microns is applied to the transferred OVD image by means of a vacuum metallised ink F.

Process colours G to H are printed on the metal layer.

The final coating for the composite sheet is a heat activated adhesive K.

The hot stamping foil obtained in the above process can be used to label an article of manufacture. The method of labeling the article of manufacture comprises the steps of: contacting the heat activated adhesive layer of the hot stamping foil obtained according to the above process with said article; hot stamping said hot stamping foil to cause said heat activated adhesive layer to adhere to said article; and removing the carrier of said hot stamping foil from said hard lacquer layer.

The optically variable device (OVD) is, for example, an diffractive optical variable image (DOVI). The term "diffractive optical variable image" as used herein may refer to any type of holograms including, for example, but not limited to a multiple plane hologram (e.g., 2-dimensional hologram, 3-dimensional hologram, etc.), a stereogram, and a grating image (e.g., dot-matrix, pixelgram, exelgram, kinegram, etc.).

Examples of an optically variable image or device are holograms or diffraction gratings, moire grating, etc. These optical microstructured images are composed of a series of structured surfaces. These surfaces may have straight or curved profiles, with constant or random spacing, and may even vary from microns to millimeters in dimension. Patterns may be circular, linear, or have no uniform pattern. For example a Fresnel lens has a microstructured surface on one side and a pano surface on the other. The microstructured surface consists of a series of grooves with changing slope angles as the distance from the optical axis increases. The draft facets located between the slope facets usually do not affect the optical performance of the Fresnel lens.

A positive Fresnel lens can be designed as a collimator, collector or with finite conjugates. These lenses are usually corrected for spherical aberration. They can also be coated for use as a second surface reflector.

A negative Fresnel lens is the opposite of a positive lens with diverging light rays. They can be coated for use as a first surface reflector.

A Fresnel cylindrical lens has a linear Fresnel structure. It collects light in one direction and the result is a line image instead of a point image.

Lenticular have linear structures where every groove has a small radius creating multiple line images. Lenticular are primarily used for projection screen and printed three-dimensional images.

Besides various diffraction grating structures like, holograms, kinegrams, direct write etc. other structures which may be included to augment these.

Images which are 'hidden' in a plane grating structure (Hidden Indicia) which looks to the naked eye like a matt area or lens structure. Information which is embedded in the structure can be text (a date or alpha numeric code) a logo or portrait which can be revealed by shining a laser pen through the image and projecting the information or images in real time.

A well established system, these are planar gratings prepared by means of a precision ruling engine with a diamond cutting tool. Gratings can be ruled on a variety of substrates; for example, glass, metal and ceramic. Groove density ranges from 20 to 1899 grooves/mm. For example the Ramsden wood gratings are equidistant circular grooves which are 1.700.000 of an inch apart, and formed the basis for the first diffraction pattern films and stamping foils.

Planar gratings with finely spaced grooves used at glancing angles in order to diffract UV light (UV, VUV, FUV and EUV) and soft X-rays.

Aberration corrected holographic, curved gratings minimize optical aberrations, such as coma, in grating-based systems. These are essential components in simple, compact, high-throughput spectrographs and monochromators, and diffraction systems employing fibre optics or solid state array detectors, or both.

One way to achieve very short l.a.s.e.r. light pulses is to use a pair of special planar diffraction gratings to compress the duration of the pulse. Gratings are made of thermally stable, temperature resistant materials to withstand intense l.a.s.e.r. light. Ultra short l.a.s.e.r. pulses are mainly used in research of fast transient phenomena.

The optically variable image can also be a zero-order diffractive microstructure having special colour effects—for example, colour change upon tilting and/or rotation. The use of zero-order diffractive microstructure as security devices in a variety of applications like banknotes, credit cards, passports, tickets, document security, anti-counterfeiting, brand protection and the like is known.

The possibility of counterfeiting decreased further by adding thermo- or photochromic dyes, UV/IR fluorescent dyes, magnetic stripes etc. into the OVD primer or ink.

Various features and aspects of the present invention are illustrated further in the examples that follow. While these examples are presented to show one skilled in the art how to operate within the scope of this invention, they are not to serve as a limitation on the scope of the invention where such scope is only defined in the claims. Unless otherwise indicated in the following examples and elsewhere in the specification and claims, all parts and percentages are by weight, temperatures are in degrees centigrade and pressures are at or near atmospheric.

EXAMPLES

Example 1

A Ni shim electroformed by PrintEtch Limited Isle of Wight UK from a 400 dpi optically variable "Starburst" image originated by PrintEtch Limited Isle of Wight UK and having pixel structures of between 0.5 and 2 microns in depth and an atomic force microscope (AFM) of 450. The Ni shim is transferred by means of a step and repeat process using a SK 450RC recombination system from Eskay Holographics Limited UK, into the surface of Teflon® FEP 160 sheet/films (a perfluoroethylene propylene copolymer available from DuPont Fluoropolymers) by means of a specific combination of heat dwell (0.01 to 99.99 seconds), pressure (up to a maximum of 10 tonnes), and electrical current (600 amps maximum) passed over the surface of the Ni shim; and cooling time or post heat dwell (1 to 299 seconds).

By these means the dot matrix "Starburst" image is pressed in its entirety into the surface of the Teflon® film and becomes permanent. The image held within the Teflon® film forms an additional shim which can be fabricated a belt configuration. This is achieved by means of joining the opposite ends of a flat sheet and joining them by means of high frequency welding, adhesion of one end to the other by means of Araldite® (manufactured by Huntsman, Basel Switzerland), or joining with a clear self adhesive tape on both the first and second surfaces.

The Teflon® belt is mounted on a transfer unit manufactured by PrintEtch Limited Isle of Wight UK incorporating an ultra violet curing lamp from GEW, Red Hill, UK. The apparatus is a configuration of cylinders which are chilled to 8° C. By these means the Teflon® belt contacts the chilled cylinders in a continuous motion and thereby is cooled from the heat generated by the ultra violet lamp system used to cure the primer coating in the transfer process.

The first surface of a coated aluminium film (thickness: 20 micron; available from Alcan) is coated with 8 g/m of a clear ultraviolet activated primer [(1-methyl-1,2-ethanediyl)bis [oxy(methyl-2,1-ethanediyl)]diacrylate (1-20%), poly(oxy-1,2-ethanediyl), α-hydroxy-[(1-oxo-2-propen-1-yl)oxy]-, ether with 2-ethyl-2-(hydroxymethyl)-1,3-propanediol (3:1) (10-50%), oligo[2-hydroxy-2-methyl-1-[4-(1-methylvinyl) phenyl]propanone] (1-5%), oxybis(methyl-2,1-ethanediyl) diacrylate (30-45%)]. The Teflon® shim comes into contact with the ultra violet primer coating which is a liquid. The surface of the Teflon® shim is contacted with the ultra violet primer and cured immediately transferring the said "Starburst" image into the surface of the ultraviolet primer resulting in an exact facsimile of the image on the surface of the Alcan Coated Aluminium.

An exceptionally brilliant optically variable device in the form of a 400 dpi image appears when subsequently a specially formulated vacuum metallised ink (vacuum metallised aluminium flakes (d50: 8-12 um; thickness: 13-17 nm) in ethyl acetate, n-propylacetate, nitrocellulose and Dowanol PM) is printed over the surface of the transferred optically variable device. The resulting image which forms a Benton (Dr. Steven Benton MIT deceased Massachusetts) array of white light which is visible when viewed in sunlight, candescent and incandescent light sources.

The operation of continuously transferring the images from the Teflon® belt to the filmic substrate can be achieved numerously without perceptible degradation of the images at normal printing machine speeds.

Instead of the coated aluminium film a roll of Rayoface™ (75 micron oriented polypropylene film manufactured by Innovia Films Wigton Cumbria UK), machine glazed carton board, postage stamp gummed paper, CBS 1 paper, postage stamp horizon paper, Sappi 40 gsm self adhesive fiscal stamp paper etc. can be used as substrate.

The invention claimed is:

1. A method for forming an optically variable image on a substrate, comprising:
   A) applying a curable composition to at least a portion of the substrate;
   B) contacting at least a portion of the curable composition with an optically variable image forming device;
   C) curing the composition;
   D) optionally depositing a layer of a transparent high refractive index material, a metallic layer, or both on at least a portion of the cured composition,
   Wherein the optically variable image forming device comprises an optically transparent embossing foil, sheet, or both carrying the optically variable image,
   Wherein the optically variable image forming device is capable of drying or curing the curable composition, and
   The foil, sheet, or both comprises an optically transparent fluoropolymer
   Wherein said optically transparent fluoropolymer is at least one material selected from the group consisting of a perfluoroethylene propylene copolymer, polytetrafluoroethylene; a copolymer comprising tetrafluorethylene (TFE) and a perfluorinated co-component; a copolymer comprising ethylene and tetrafluorethylene (EFFE); a polyvinylidenfluoride (PVDF) copolymer and a PVDF-homopolymer; a copolymer comprising tetrafluorethylene and hexafluorpropylene (HFP); and a terpolymer comprising TFE, HFT, and vinylidenfluoride (VDF) units.

2. The method of claim 1, wherein the curable composition comprises a pigment, a dye, or both.

3. The method of claim 1, wherein the substrate is a non-transparent sheet material.

4. The method of claim 1, wherein the curable composition is deposited by gravure or flexographic printing.

5. The method of claim 1, wherein curing the curable composition comprises curing with an ultraviolet light, an electron beam, or both.

6. The method of claim 1, comprising depositing a metallic layer,
   wherein depositing the metallic layer comprises depositing a metallic ink which comprises at least one metal selected from the group consisting of aluminium, stainless steel, nichrome, gold, silver, platinum, and copper.

7. The method of claim 1, wherein the optically variable image forming device comprises an optically transparent embossing foil, which comprises a belt.

8. The method of claim 1, wherein said curable composition is cured by UV irradiation through said foil or sheet.

9. The method of claim 1, wherein said embossing foil or sheet or both of said optically transparent fluoropolymer carrying said optically variable image to be applied is prepared by thermally embossing an original optically variable image into an optically transparent fluoropolymer.

* * * * *